US012631699B2

(12) United States Patent
Hileman et al.

(10) Patent No.: US 12,631,699 B2
(45) Date of Patent: May 19, 2026

(54) MAGNETIC SENSING OPTICAL FIBER WITH INSCRIBED FIBER OPTIC SENSORS

(71) Applicant: VIRGINIA TECH INTELLECTUAL PROPERTIES, INC., Blacksburg, VA (US)

(72) Inventors: Zachary Daniel Hileman, Manchester, NH (US); Daniel Homa, Blacksburg, VA (US); Gary Pickrell, Shawsville, VA (US); Eileen Martin, Denver, CO (US)

(73) Assignee: VIRGINIA TECH INTELLECTUAL PROPERTIES, INC., Blacksburg, VA (US)

( * ) Notice: Subject to any disclaimer, the term of this patent is extended or adjusted under 35 U.S.C. 154(b) by 158 days.

(21) Appl. No.: 18/332,248

(22) Filed: Jun. 9, 2023

(65) Prior Publication Data

US 2024/0053415 A1 Feb. 15, 2024

Related U.S. Application Data

(60) Provisional application No. 63/370,826, filed on Aug. 9, 2022.

(51) Int. Cl.
*G01R 33/09* (2006.01)

(52) U.S. Cl.
CPC .................................. *G01R 33/091* (2013.01)

(58) Field of Classification Search
CPC .......................... G01R 33/0327; G01R 33/091; G01R 33/032; G01R 15/22; G01R 15/246;

(Continued)

(56) References Cited

U.S. PATENT DOCUMENTS 4,371,838 A 2/1983 Griscom
4,433,291 A 2/1984 Yariv et al.
(Continued)

OTHER PUBLICATIONS

Oh, Ki Dong. Chapter 5: Active/Passive Hybrid Temperature Compensation and Signal Demodulation. In Optical Fiber Fabry-Perot Interferometer Based Sensor Instrumentation System for Low Magnetic Field Measurement. Virginia Tech, Dec. 1997. United States.
(Continued)

*Primary Examiner* — Alvaro E Fortich
(74) *Attorney, Agent, or Firm* — Perilla Knox & Hildebrandt LLP; Jonathan A. Paulis

(57) ABSTRACT

A magnetic field sensor in the form of a multi-material optical fiber is described. The magnetic sensing optical fiber of the present disclosure can leverage optics and magnetostriction to sense an external magnetic field adjacent to the fiber. The magnetic sensing optical fiber can be customized to achieve various desired sensing sensitivities for various applications, including measuring while drilling and unconventional oil and gas applications. In one example, an optical fiber can include a cladding that can extend from a first end to a second end of the optical fiber. The optical fiber can further include an optical core within the cladding. The optical core can extend along the optical fiber between the first end and the second end. The optical fiber can also include a magnetostrictive element within the cladding. The magnetostrictive element can extend along the optical fiber between the first end and the second end.

20 Claims, 8 Drawing Sheets

(58) Field of Classification Search

CPC .... G01R 33/0322; G01R 33/09; G01R 33/10; G02B 1/00; G02B 1/002; G02B 1/007; G02B 1/005; G02B 1/02; G02B 1/04; G02B 1/045; G02B 1/046; G02B 1/048; G02B 1/06; G02B 1/08; G02B 6/00; G02B 6/0001; G02B 6/0005

See application file for complete search history.

(56) References Cited

U.S. PATENT DOCUMENTS

| | | | |
|---|---|---|---|
| 5,812,711 | A | 9/1998 | Glass et al. |
| 6,433,543 | B1 * | 8/2002 | Shahinpoor ........ G01R 33/0327 |
| | | | 324/96 |
| 9,823,277 | B1 * | 11/2017 | Lagakos ............ G01R 19/0092 |
| 10,107,839 | B1 * | 10/2018 | Lagakos ................ G01R 15/24 |
| 2005/0062979 | A1 * | 3/2005 | Zhu ........................ G01L 9/0079 |
| | | | 356/480 |
| 2010/0103978 | A1 * | 4/2010 | Lee ......................... G01K 11/32 |
| | | | 374/E11.015 |
| 2013/0027030 | A1 * | 1/2013 | Twerdochlib .......... H02K 11/20 |
| | | | 324/244.1 |
| 2013/0154632 | A1 * | 6/2013 | McEwen-King .... G02B 6/4401 |
| | | | 385/100 |
| 2020/0209466 | A1 * | 7/2020 | Sanborn ................. G02B 6/243 |
| 2022/0034688 | A1 * | 2/2022 | Godfrey ............. G01K 11/3206 |

OTHER PUBLICATIONS

Oh, Ki Dong. Chapter 6: Conclusions. In Optical Fiber Fabry-Perot Interferometer Based Sensor Instrumentation System for Low Magnetic Field Measurement. Virginia Tech, Dec. 1997, United States.

Oh, Ki Dong; Ranade, Jaydeep; Arya, Vivek; Wang, Anbo; Claus, Richard O. Miniaturized Fiber Optic Magnetic Field Sensors. Proceedings of SPIE, Jan. 1999, pp. 136-142, vol. 3538. SPIE, Bellingham, Washington, United States.

Okamura, H. Fibre-Optic Magnetic Sensor Utilising Metal-Coated Fibre. Electronics Letters, Jul. 1987, pp. 834-835. Institution of Electrical Engineers, United Kingdom.

Palmieri, Luca; Galtarossa, Andrea. Distributed Fiber Optic Sensor for Mapping of Intense Magnetic Fields Based on Polarization Sensitive Reflectometry. Proceedings of SPIE, Third Asia Pacific Optical Sensors Conference, 2012, pp. 1-8. SPIE, Bellingham, Washington, United States.

Palmieri, Luca; Galtarossa, Andrea. Distributed Measurement of Intense Magnetic Fields by Means of Optical Fibers. PIERS Proceedings, Aug. 2014, pp. 1290-1294, PIERS, Guangzhou, China.

Palmieri, Luca; Galtarossa, Andrea. Reflectometric Fiber Optic Sensor for Distributed Measurement of Intense Magneto-Static Fields. Proceedings of the 10th IEEE Conference on Sensors, Oct. 2011, pp. 117-120. IEEE, Limerick, Ireland.

Picon, Laura L.; Kolesar, Edward S.; Bright, Victor M. Low-Intensity Magnetic Field Detection with a Magnetostrictive Fiber Optic Interferometric Sensor. Proceedings of SPIE, Fiber Optic and Laser Sensors XII, 1994, pp. 14-25. SPIE, Bellingham, Washington, United States.

Prasai, Chris; Krause, Ben; Mc Mullin, M. Lee; Tayag, Tristan J. Design Considerations of a Fiber Interferometric Magnetic Sensor. Proceedings of SPIE, Fiber Optic Sensors and Applications XVI, May 2019, Paper 110000Q. Spie, Bellingham, Washington, United States.

Quintero, Sully M. M.; Martelli, Cicero; Braga, Arthur M. B.; Valente, Luiz C. G.; Kato, Carla C. Magnetic Field Measurements Based on Terfenol Coated Photonic Crystal Fibers. Sensors, Nov. 2011, p. 11103-11111, vol. 11, Issue 12. MDPI, Switzerland.

Rengarajan, S.; Walser, R. M. High-Speed Fiber-Optic Sensor for Magnetic-Field Mapping. Journal of Applied Physics, 1997, pp. 4278-4280, vol. 81. AIP, United States.

Savage, H. T.; Spano, M. L. Theory and Application of Highly Magnetoelastic Metglas 2605SC. Journal of Applied Physics, Nov. 1982, pp. 8092-8097, vol. 53. American Institute of Physics, United States.

Sedlar, Miroslav; Paulicka, Ivan; Sayer, Michael. Optical Fiber Magnetic Field Sensors with Ceramic Magnetostrictive Jackets. Applied Optics, 1996, pp. 5340-5344, vol. 35, No. 27. Optical Society of America, United States.

Selleri, Stefano; Coscelli, Enrico; Sozzi, Michele; Cucinotta, Annamaria; Poli, Federica; Passaro, Davide. Air-Suspended Solid-Core Fibers for Sensing. Proceedings of SPIE, vol. 7356 (European Optics & Optoelectronics Symposium), Apr. 2009, pp. 1-6, Bellingham, Washington, United States.

Shu, Yuanchao; Bo, Cheng; Shen, Guobin; Zhao, Chunshui; Li, Liqun; Zhao, Feng. Magicol: Indoor Localization Using Pervasive Magnetic Field and Opportunistic WiFi Sensing. IEEE Journal on Selected Areas in Communications, Jul. 2015, pp. 1443-1457, vol. 33. IEEE, United States.

Smith, C. H.; Barberi, L. Dynamic Magnetization of Metallic Glasses. Proceedings of the 5th IEEE International Pulse Power Conference, Jun. 1985, pp. 664-667. IEEE, United States.

Sui, Yangyi; He, Wei; Xia, Zhenghui; Liu, Shibin; Leslie, Keith. Error Analysis and Correction of a Downhole Rotating Magnetic Full-Tensor Gradiometer. IEEE Access, Jan. 2020, pp. 127-139, vol. 8. IEEE, United States.

Thomas, Senoy; Mathew, Jinesh; Radhakrishnan, P.; Nampoori, V. P. N.; George, A. K.; Al-Harthi, S. H.; Ramanujan, R. V.; Ananthara-man, M. R. Metglas Thin Film Based Magnetostrictive Transducers for Use in Long Period Fibre Grating Sensors. Sensors and Actuators A: Physical, 2010, pp. 83-90, vol. 161. Elsevier, Netherlands.

Tzou, H. S.; Lee, H.-J.; Arnold, S. M. Smart Materials, Precision Sensors/Actuators, Smart Structures, and Structronic Systems. Mechanics of Advanced Materials and Structures, 2004, pp. 367-393, vol. 11. Taylor & Francis, United Kingdom.

Wang, Xin; Chen, Shuying; Du, Zhigang; Wang, Xiaoyang; Shi, Changhai; Chen, Jianping. Experimental Study of Some Key Issues on Fiber-Optic Interferometric Sensors Detecting Weak Magnetic Field. IEEE Sensors Journal, Jul. 2008, pp. 1173-1179, vol. 8. IEEE, United States.

Yariv, Amnon; Winsor, Harry V. Proposal for Detection of Magnetic Fields Through Magnetostrictive Perturbation of Optical Fibers. Optics Letters, Mar. 1980, pp. 87-89, vol. 5, No. 3. The Optical Society, United States.

Zhang, Liming; Qi, Ji; Li, Lixin; Zhang, Kai; Sun, Zhixue; Yang, Yongfei; Luo, Qin. A Forward Modeling Method Based on Electromagnetic Theory to Measure the Parameters of Hydraulic Fracture. Fuel, 2019, pp. 466-473, vol. 251. Elsevier, Netherlands.

Zou, Kun; Cheng, Yuqi. Optimum Design of Transducer for Fiber-Optic Magnetometer. Proceedings of SPIE, International Conference on Optical Fibre Sensors in China, 1991, pp. 472-476. SPIE, Bellingham, Washington, United States.

Ahamed, Eistiak; Faruque, Mohammad R. I.; Tamim, Ahmed M.; Islam, Mohammad T.; Islam, M. T. Enhancement of Magnetic Field Intensity with a Left-Handed Metamaterial Tunnel Resonator for Obstacle Sensing. Chinese Journal of Physics, 2021, pp. 91-105, vol. 70. Chinese Physical Society, Taiwan.

Biriukov, A.S.; Bevolov, M.I.; Bogatyrjov, V.A.; Dianov, E.M.; Lebedev, V.F.; Sysolyatin, A.A.; Khitun, A.G. Magnetosensitive Ni-Coated Optical Fibers. MRS Symposium Proceedings, 1998, pp. 291-295, vol. 531. Materials Research Society, United States.

Bucholtz, F.; Dagenais, C.; Jackson, D.A. High-Frequency Fibre-Optic Magnetometer with 70fT/VHz Resolution. Electronics Letters, Dec. 7, 1989, pp. 1719-1721, vol. 25, No. 25. The Institution of Electrical Engineers (IEE), United Kingdom.

Bucholtz, F.; Koo, K. P.; Dandridge, A. Effect of External Perturbations on Fiber-Optic Magnetic Sensors. Journal of Lightwave Technology, 1988, pp. 507-512, vol. 6. IEEE, United States.

Bucholtz, F.; Koo, K. P.; Dandridge, A.; Sigel, G. H., Jr. Easy Axis Distribution in Transversely Annealed Metglas 2605 S2. Journal of Magnetism and Magnetic Materials, 1986, pp. 1607-1608, vol. 54-57. Elsevier, Netherlands.

Bucholtz, F.; Koo, K. P.; Yurek, A. M.; Mcvicker, J. A.; Dandridge, A. Preparation of Amorphous Metallic Glass Transducers for Use in

(56)　　　　　References Cited

OTHER PUBLICATIONS

Fiber Optic Magnetic Sensors. Journal of Applied Physics, Apr. 1987, pp. 3790-3792, vol. 61. United States.

Bucholtz, Frank; Koo, K. P.; Sigel, George H., Jr.; Dandridge, Anthony. Optimization of the Fiber/ Metallic Glass Bond in Fiber-Optic Magnetic Sensors. Journal of Lightwave Technology, Aug. 1985, pp. 814-817, vol. 3. IEEE /The Institute of Electrical and Electronics Engineers, United States.

Cobalt Development Institute. Magnetic Alloys. In Cobalt Facts, 2006, pp. 23-28. CDI, United Kingdom.

Cruz, J. L.; Diez, A.; Andres, M. V.; Segura, A.; Ortega, B.; Dong, L. Fibre Bragg Gratings Tuned and Chirped Using Magnetic Fields. Electronics Letters, 1997, pp. 235-236, vol. 33, No. 3. Institution of Electrical Engineers, United Kingdom.

Dagenais, D. M.; Bucholtz, F.; Koo, K. P.; Dandridge, A. Detection of Low-Frequency Magnetic Signals in a Magnetostrictive Fiber-Optic Sensor With Suppressed Residual Signal. Journal of Lightwave Technology, Jun. 1989, pp. 881-887, vol. 7, No. 6. United States.

Dandridge, A.; Tveten, H. B.; Sigel, G. H.; West, E. J. Optical Fibre Magnetic Field Sensors. Electronics Letters, May 22, 1980, pp. 408-409, vol. 16. IEE (The Institution of Electrical Engineers), United Kingdom.

Dandridge, Anthony; Koo, K. P.; Bucholtz, F.; Dagenais, D. M. Amorphous Metal Wire Transducers for Fiber Optic Magnetometer. Proceedings of the 6th International Conference on Optical Fiber Sensors (OFS '89), Jan. 1989, pp. 366-372, Springer-Verlag, Berlin, Germany.

Dapino, M. J. Magnetostrictive Materials: Their Use in Smart Structure Applications. Encyclopedia of Smart Materials, 2000, pp. 600-620, John Wiley & Sons, Inc .; New York, United States.

De Souza, Pat D.; Mermelstein, Marc D. Electric Field Detection with a Piezoelectric Polymer-Jacketed Single- Mode Optical Fiber. Applied Optics, Dec. 1982 (vol. 21, No. 23), pp. 4214-4218. Optical Society of America, United States.

Ding, Zhenyang; Du, Yang; Liu, Tiegen; Liu, Kun; Feng, Bowen; Jiang, Junfeng. Distributed Optical Fiber Current Sensor Based on Magnetostriction in Ofdr. IEEE Photonics Technology Letters, 2015, pp. 2055-2058, vol. 27, No. 19. IEEE, United States.

Du, Yang; Liu, Tiegen; Ding, Zhenyang; Liu, Kun; Feng, Bowen; Jiang, Junfeng. Distributed Magnetic Field Sensor Based on Magnetostriction Using Rayleigh Backscattering Spectra Shift in Optical Frequency-Domain Reflectometry. Applied Physics Express, 2015, Article 012401, vol. 8. Japan Society of Applied Physics, Japan.

Emmons, Michael C.; Kim, Hyungsuk K. D.; Carman, Gregory P.; Richards, W. Lance. Magneto-Optic Field Coupling in Optical Fiber Bragg Gratings. Optical Fiber Technology, May 2012, pp. 157-160, vol. 18. Elsevier, United Kingdom.

Fabiny, Larry; Vohra, Sandeep T.; Bucholtz, Frank. Multiplexed Low-Frequency Electric and Magnetic Field Fiber Optic Sensors. Optical Fiber Technology, 1996, pp. 106-113, vol. 2. Elsevier, Netherlands.

Fang, Zhao. Ultra-Sensitive Magnetic Sensors Integrating the Giant Magnetoelectric Effect with Advanced Microelectronics. Ph.D. dissertation, Electrical Engineering, Aug. 31, 2011. The Pennsylvania State University, United States.

Fujii, Yoichi; Gong, Zhi-Bing; Tada, Kazuo; Nishioka, Masao; Mori, Takao; Ozaki, Masao; Ishida, Takashi. New Applications of Fibre-Optic Magnetic Field Sensor by Employing Magnetostriction. Proceedings of SPIE, Fiber Optic Sensors II, 1987, pp. 275-282. SPIE, Bellingham, Washington, United States.

Gooneratne, Chinthaka P.; Li, Bodong; Moellendick, Timothy E. Downhole Applications of Magnetic Sensors. Sensors, Oct. 2017, Article 2384, vol. 17, No. 10. MDPI, Switzerland.

Hartman, N.; Vahey, D.; Kidd, R.; Browning, M. Fabrication and Testing of a Nickel-Coated Single-Mode Fibre Magnetometer. Electronics Letters, Mar. 4, 1982, pp. 224-226, vol. 18, No. 5. Institution of Electrical Engineers, United Kingdom.

Hayes, Guy H.; Hines, William A.; Yang, De Ping; Budnick, Joseph I. Low-Field Magnetic Anisotropy in Metglas 2605 CO Ribbons. Journal of Applied Physics, Apr. 1985, pp. 3511-3513, vol. 57. American Institute of Physics, United States.

Homa, Daniel; Kaur, Gurbinder; Pickrell, Gary; Scott, Brian; Hill, Cary. Electronic and Magnetic Fibers. Materials Letters, 2014, pp. 135-138, vol. 133. Elsevier, Amsterdam, Netherlands.

Hu, Jiafei; Pan, Mengchun; Xin, Jianguang; Chen, Dixiang. Strain of Optic-Fiber/Giant Magnetostrictive Film Structure in Magnetic Field by Finite Element Analysis. Proceedings of SPIE, pp. 1-8, vol. 7157, Dec. 2008. SPIE, Bellingham, Washington, United States.

Issadore, D.; Park, Y. I.; Shao, H.; Min, C.; Lee, K .; Liong, M.; Weissleder, R.; Lee, H. Magnetic Sensing Technology for Molecular Analyses. Lab on a Chip, Jun. 2, 2014, pp. 2385-2397, vol. 14. Royal Society of Chemistry, United Kingdom.

Jarzynski, J.; Cole, J. H.; Bucaro, J. A.; Davis, C. M., Jr. Magnetic Field Sensitivity of an Optical Fiber with Magnetostrictive Jacket. Applied Optics, 1980, pp. 3746-3748, vol. 19, No. 22. Optical Society of America, United States.

Koo, K. P.; Bucholtz, F.; Dagenais, D. M.; Dandridge, A. A Compact Fiber-Optic Magnetometer Employing an Amorphous Metal Wire Transducer. IEEE Photonics Technology Letters, Dec. 1989, pp. 464-466, vol. 1. IEEE, United States.

Koo, K. P.; Dandridge, Anthony; Tveten, A. B.; Sigel, George H., Jr. A Fiber-Optic DC Magnetometer. IEEE Journal of Lightwave Technology, Sep. 1983, pp. 524-525, vol. LT-1, No. 3. IEEE, United States.

Koo, K. P.; Sigel, G. H., Jr. Characteristics of Fiber-Optic Magnetic-Field Sensors Employing Metallic Glasses. Optics Letters, Jul. 1982, pp. 334-336, vol. 7. Optical Society of America, United States.

Koo, K. P.; Sigel, G. H., Jr. Detection Scheme in a Fiber-Optic Magnetic-Field Sensor Free from Ambiguity Due to Material Magnetic Hysteresis. Optics Letters, 1984, pp. 257-259, vol. 9. Optical Society of America, United States.

Larson, D. C.; Bibby, Y. W.; Tyagi, S. Metallic-glass-coated Optical Fibers as Magnetic Field Sensors. Proceedings of SPIE, 1991, pp. 517-522. SPIE, Bellingham, Washington, United States.

Lee, E. W.; Asgar, M. A. The Magnetostriction of Nickel. Proceedings of the Royal Society of London. Series A, Mathematical and Physical Sciences, Dec. 21, 1971, pp. 73-85, vol. 326. The Royal Society, United Kingdom.

Lee, Kyung-Shik; Kang, Hyun Seo; Park, Moo Youn. Fiber Optic Magnetostrictive Transducers for Magnetic Field Sensing. Optical Engineering, Dec. 1995, vol. 34, No. 12, pp. 3577-3582. SPIE / Optical Engineering Society, Bellingham, Washington, United States.

Lee, Kyung-Shik; Lee, Yu Sheop; Suh, Su Jeong. Magnetostrictive Transducers for Optical Fiber Magnetic Field Sensors. Proceedings of SPIE, Fiber Optic and Laser Sensors XII, 1994, pp. 57-65. SPIE, Bellingham, Washington, United States.

Li, Qi; Chen, Haiyan. Design of Fiber Magnetic Field Sensor Based on Fiber Bragg Grating Fabry-Perot Cavity Ring-Down Spectroscopy. Photonic Sensors, Feb. 7, 2015, pp. 189-192, vol. 5. Springer, United Kingdom.

Liu, Yanbing; Zhang, Jinru. The Relation of the Sensitivity of an Optical Fibre Magnetostrictive Sensor to Its Magnetostrictive Jacket Thickness. Laser-Optoelectronics in Engineering, 1990, pp. 774-779. Springer, Berlin, Germany.

Livingston, J. D. Magnetomechanical Properties of Amorphous Metals. Physica Status Solidi A, 1982, pp. 591-596, vol. 70, No. 2. Walter de Gruyter GmbH, Berlin, Germany.

Masoudi, Ali; Newson, Trevor p. Distributed Optical Fibre Dynamic Magnetic Field Sensor Based on Magnetostriction. Applied Optics, 2014, pp. 2833-2838, vol. 53. Optical Society of America, United States.

Metglas, Inc. Amorphous Alloys for Transformer Cores. Apr. 29, 2011.

Mora, J.; Díez, A.; Cruz, J. L.; Andres, M. V. A Magnetostrictive Sensor Interrogated by Fiber Gratings for DC- Current and Temperature Discrimination. IEEE Photonics Technology Letters, Dec. 2000, pp. 1680-1682, vol. 12, No. 12. IEEE, United States.

Murzin, Dmitry; Mapps, Desmondo J.; Levada, Kateryna; Belyaev, Victor; Omelyanchik, Alexander; Panina, Larissa; Rodionova, Valeria.

(56)          References Cited

OTHER PUBLICATIONS

Ultrasensitive Magnetic Field Sensors for Biomedical Applications. Sensors, Mar. 11, 2020, pp. 1-32, vol. 20, No. 6. MDPI, Switzerland.

Nader-Rezvani, N.; Claus, Richard O.; Sarrafzadeh, A. K. Low-Frequency Fiber-Optic Magnetic-Field Sensors. Optical Engineering, 1992, pp. 23-27, vol. 31. SPIE, United States.

Nain, Hasril; Che Isa, Mahdi; Mohdsli, Moesli; Yusoff, Nik Hassanuddin; Yati, Mohd Subhi; Nor, Irwan. Management of Naval Vessels' Electromagnetic Signatures: A Review of Sources and Countermeasures. Defence S&T Technical Bulletin, 2013, pp. 93-110, vol. 6, No. 2. Science & Technology Research Institute for Defence (STRIDE), Malaysia.

Oh, Ki Dong; Ranade, Jaydeep; Arya, Vivek; Claus, Richard O. Optical Fiber Fabry-Pérot Interferometric Sensor for Magnetic Field Mearsurement. IEEE Photonics Technology Letters, Jun. 1997, pp. 797-799, vol. 9. IEEE, United States.

Oh, Ki Dong; Ranade, Jaydeep; Arya, Vivek, Wang; Anbo, Claus, Richard O. FIber Optic Fabry-Pérot Interferometric Sensor for Magnetic Field Mearsurement. IEEE Photonics Technology Letters, Jun. 1997, pp. 797-799, vol. 9. IEEE, United States.

Oh, Ki Dong; Wang, Anbo; Claus, Richard O. Fiber-optic extrinsic Fabry-Perot dc magnetic field sensor. Optics Letters, Sep. 15, 2004, pp. 2115-2117, vol. 29. Optical Society of America, United States.

Oh, Ki Dong. Chapter 1: Introduction. In Optical Fiber Fabry-Perot Interferometer Based Sensor Instrumentation System for Low Magnetic Field Measurement. Virginia Tech, Dec. 1997. United States.

Oh, Ki Dong. Chapter 2: Extrinsic Farby-Perot Interferometer Measuring Magnetic Field. In Optical Fiber Fabry-Perot Interfermeter Based Sensor Instrumentation System for Low Magnetic Field Measurement. Virginia Tech, Dec. 1997, United States.

Oh, Ki Dong. Chapter 3: Sensor Performance Enhancement. In Optical Fabry-Perot Interferometer Based Sensor Instrumentation System for Low Magnetic Field Measurment. Virginia Tech, Dec. 1997, United States.

* cited by examiner

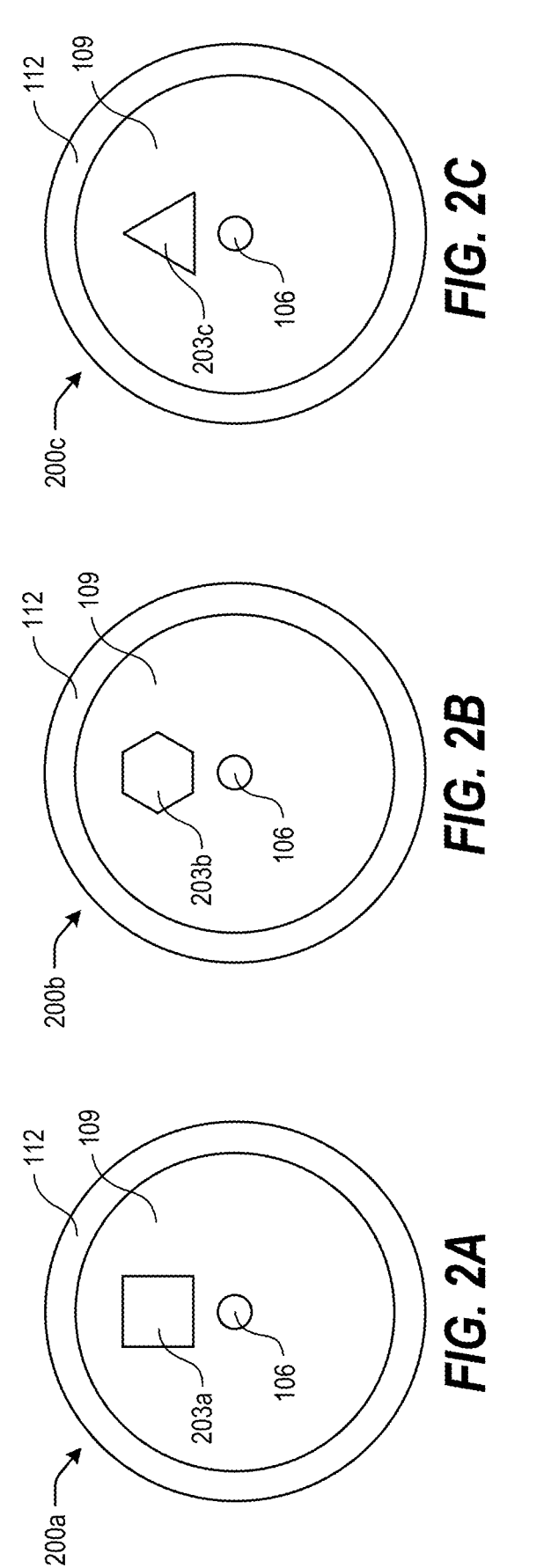
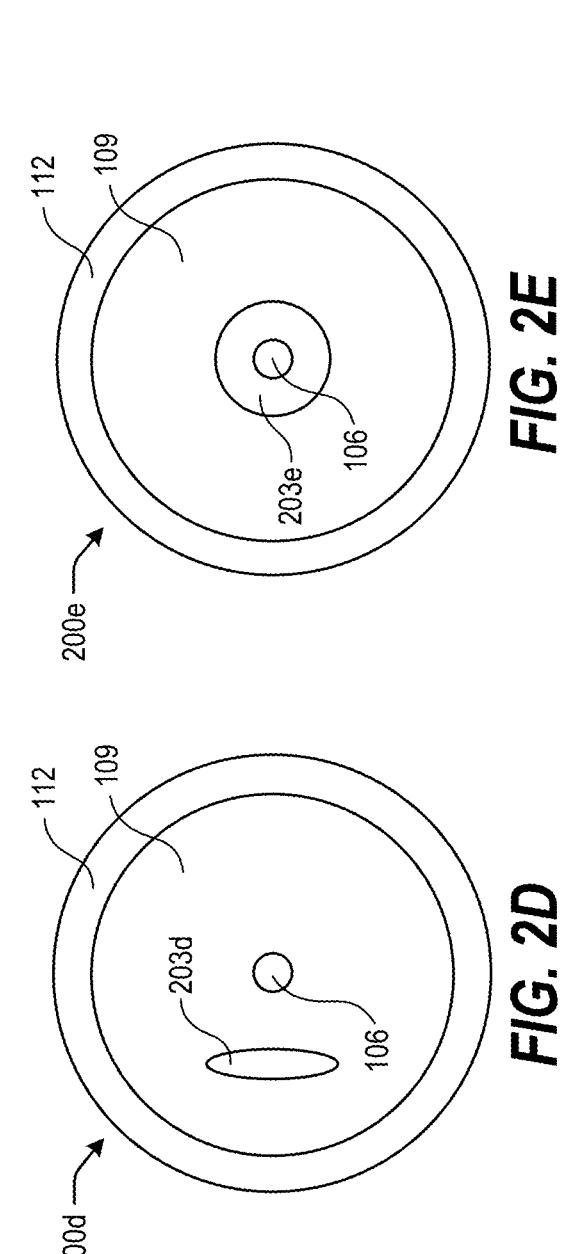
FIG. 2A
FIG. 2B
FIG. 2C
FIG. 2D
FIG. 2E

MAGNETIC SENSING OPTICAL FIBER WITH INSCRIBED FIBER OPTIC SENSORS

CROSS-REFERENCE TO RELATED APPLICATION

This application claims the benefit of and priority to U.S. Provisional Patent Application No. 63/370,826, titled "Magnetic Sensing Optical Fiber," filed Aug. 9, 2022, the entire contents of which is hereby incorporated by reference herein.

STATEMENT OF FEDERALLY SPONSORED RESEARCH OR DEVELOPMENT

This invention was made with government support under grant number DE-FE0031786, awarded by the U.S. Department of Energy. The government has certain rights in the invention.

BACKGROUND

In recent years, magnetic sensing has seen increasing interest in applied geotechnical systems, with investment opportunities spanning from military to commercial entities. Complex smart materials and metamaterials have also entered public domain meeting a variety of needs with high threshold sensing capabilities. Unconventional oil and gas resources have played a large role in the development of new and improved magnetic sensors, to fully captivate the complex situations that wellbore, subsurface hydraulic fracture geometry, fluid flow, and large-scale pipelines have introduced. Down hole magnetic field characterization has been left largely to nuclear magnetic resonance and fluxgate magnetometer sensors for unconventional oil and gas resources, and few improvements have been proposed in recent years. Given the current state of measuring while drilling for down hole applications, consolidation and scalability of multiple sensor types, such as tri-axial fluxgate magnetometers, tri-axial accelerometers, and mud-pulse telemetry systems, may need to be researched further.

SUMMARY

The present disclosure is directed to a magnetic field sensor in the form of a multi-material optical fiber. The magnetic sensing optical fiber of the present disclosure can leverage optics and magnetostriction to sense an external magnetic field adjacent to the fiber. The magnetic sensing optical fiber can be customized to achieve various desired sensing sensitivities for various applications, including measuring while drilling and unconventional oil and gas applications.

Aspects and advantages of embodiments of the present disclosure will be set forth in part in the following description or can be learned from the description or through practice of the embodiments. Other aspects and advantages of embodiments of the present disclosure will become better understood with reference to the appended claims and the accompanying drawings, all of which are incorporated in and constitute a part of this specification. The drawings illustrate example embodiments of the present disclosure and, together with the description, serve to explain the related concepts of the present disclosure.

According to one example embodiment, an optical fiber can include a cladding that can extend from a first end to a second end of the optical fiber. The optical fiber can further include an optical core within the cladding. The optical core can extend along the optical fiber between the first end and the second end. The optical fiber can also include a magnetostrictive element within the cladding. The magnetostrictive element can extend along the optical fiber between the first end and the second end.

BRIEF DESCRIPTION OF THE DRAWINGS

Many aspects of the present disclosure can be better understood with reference to the following figures. The components in the figures are not necessarily to scale, with emphasis instead being placed upon clearly illustrating the principles of the disclosure. Moreover, repeated use of reference characters or numerals in the figures is intended to represent the same or analogous features, elements, or operations across different figures. Repeated description of such repeated reference characters or numerals is omitted for brevity.

FIG. 2A illustrates a cross section of another example magnetic sensing optical fiber according to at least one embodiment described herein.

FIG. 2B illustrates a cross section of another example magnetic sensing optical fiber according to at least one embodiment described herein.

FIG. 2C illustrates a cross section of another example magnetic sensing optical fiber according to at least one embodiment described herein.

FIG. 2D illustrates a cross section of another example magnetic sensing optical fiber according to at least one embodiment described herein.

FIG. 2E illustrates a cross section of another example magnetic sensing optical fiber according to at least one embodiment described herein.

DETAILED DESCRIPTION

Figure 1:
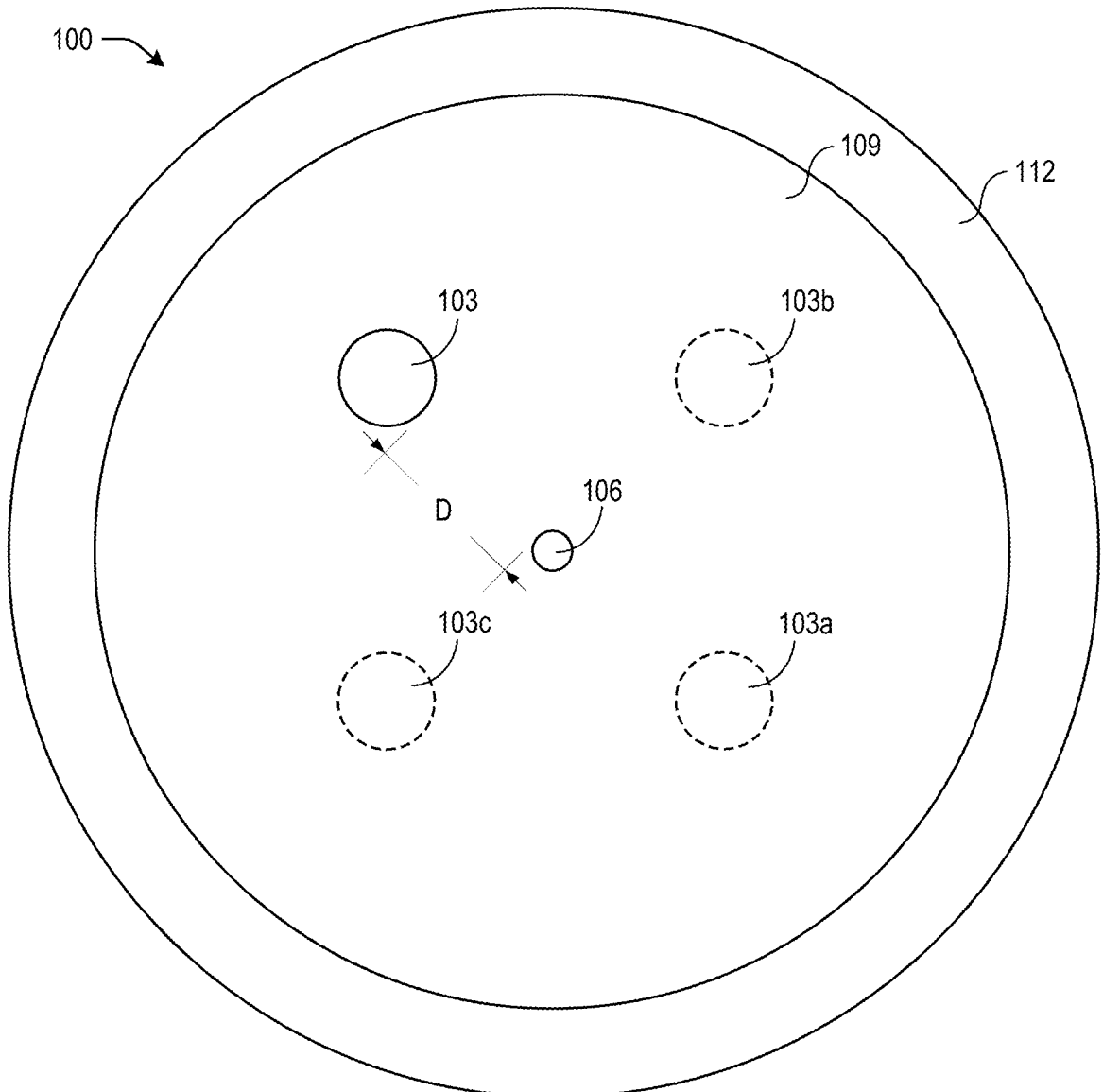
FIG. 1 illustrates a cross section of an example magnetic sensing optical fiber according to various embodiments described herein.

As noted above, down hole magnetic field characterization has been left largely to nuclear magnetic resonance (NMR) and fluxgate magnetometer (FMG) sensors for unconventional oil and gas (UOG) resources, and few improvements have been proposed in recent years. Given the current state of measuring while drilling (MWD) systems used for down hole applications, consolidation and scalability of multiple sensor types is seemingly the next step for improving such systems. However, consolidation and scalability of different sensing types introduces complications that are difficult to overcome, such as maintaining high sensitivity, matching interconnect types, and increasing costs. These limitations have likely contributed to the few recent improvements in MWD systems.

The present disclosure provides solutions to address the above-described current state of MWD systems used for down hole applications in general and with respect to the complications associated with consolidating and scaling different sensors as described above. To overcome such limitations, various examples of the present disclosure describe a magnetic field sensor in the form of a multi-material optical fiber. The magnetic sensing optical fiber of the present disclosure can leverage optics and magnetostriction to sense an external magnetic field adjacent to the fiber.

Magnetostriction is a property of magnetic materials that results in a change of the shape or dimensions of the materials during the process of magnetization of the materials or when the magnetic materials are present in a magnetic field. Thus, magnetostrictive materials can convert magnetic field energy into kinetic energy. This property of magnetostrictive materials can be quantified by the magnetostrictive coefficient, $\lambda$, which may be positive or negative and is defined as the fractional change in length as the magnetization of the material increases from zero to the saturation value. Cobalt (Co), for example, exhibits a relatively large magnetostriction. Nickel (Ni) is another example of a single metal material that exhibits magnetostriction, and a number of metal alloys are also known to exhibit magnetostriction.

The present disclosure relates to an optical fiber including one or more ferromagnetic or magnetostrictive elements. The fiber can be used as a magnetic sensing optical fiber. The number, sizes, and positions of the magnetostrictive elements embedded in an optical cladding of the fiber can be controlled and selected in the preforms from which the fiber is made. The magnetostrictive elements can be placed at desired positions and distances, as measured from the optical core and/or one end of the fiber, to control the response of the fiber in the presence of magnetic fields. The fiber can also include a variety of fiber optic sensors such as, for instance, inscribed fiber Bragg gratings (FBGs). The geometries and positions of the magnetostrictive elements in the fiber can be controlled at the preform stage through a preform stacking method. Considering factors such as performance, cost efficacy, scalability, compatibility with current MWD and UOG applications, and other concerns, the present disclosure presents new multi-material magnetic sensing optical fibers and methods of manufacture of such fibers.

When preparing preforms for the magnetic sensing optical fibers described herein, a stacking method can be relied upon to include magnetostrictive materials at certain locations in the preform. The magnetostrictive materials can be included in the form of powders, rods, ribbons, or shavings, as examples. The selection of the magnetostrictive materials can be informed by the fabrication method, fiber cladding and core materials, the desired properties of the resulting fibers, and the sensing application for the resulting fibers.

The magnetic sensing optical fibers described herein can be used in a variety of applications. One application exists in the field of optical fiber sensing. A sensing scheme for the fibers described herein includes the magnetostriction of the ferromagnetic element(s) in the fibers, which results in an internally-distributed strain over region(s) in the fibers exposed to the magnetic fields. Thus, the fibers can be used to sense time-dependent changes in magnetic fields to which the fibers are subjected. Based on the sensor element configuration chosen for a given fiber, the sensitivity of the fiber to magnetic field strengths can be relatively high and suitable for sensing applications. With inscribed Bragg gratings in the fibers, the magnetic sensing resolution in one fiber tested reached as low as $10e^{-9}$ Tesla (T) according to one example.

The magnetic sensing optical fibers of the present disclosure provide several technical benefits and advantages. For example, the compact composite structure of a magnetic sensing optical fiber described herein can provide mechanical and optical robustness not provided by existing magnetic sensors used in UOG and MWD applications. For instance, the design of a magnetic sensing optical fiber described herein can be customized to achieve a desired strain sensitivity by adjusting at least one of the cross-sectional size of one or more magnetostrictive elements in the fiber or their distance from an optical core of the fiber. In one example, the strain sensitivity of a magnetic sensing optical fiber described herein can be increased by increasing the cross-sectional size of a magnetostrictive element in the fiber and/or decreasing the distance from the magnetostrictive element to an optical core of the fiber. In another example, the strain sensitivity of a magnetic sensing optical fiber described herein can be decreased by decreasing the cross-sectional size of a magnetostrictive element in the fiber and/or increasing the distance from the magnetostrictive element to an optical core of the fiber.

In addition, the magnetic sensing optical fibers described herein can be further customized for specialized magnetic field sensing applications by using certain alloys to form the magnetostrictive element(s) of the fiber. For example, Metglas® can be used to sense relatively low magnetic flux densities (e.g., less than or equal to approximately 3 microteslas ($\mu$T)), whereas Terfenol-D™ can be used to sense relatively high magnetic flux densities (e.g., less than or equal to approximately 100 milliteslas (mT)). The magnetic sensing optical fibers described herein can also be customized to any desired diameter based on the limitations of the optical fiber draw tower. The fibers can be further customized to significant and useful lengths, even to tens of kilometers if desired, based upon the size of the preform from which the fibers are drawn.

Additionally, the magnetostrictive element(s) of any magnetic sensing optical fiber described herein can be formed using nickel, which is relatively more cost effective compared to engineered alloys. Nickel is also highly desirable from an optical preform manufacturing standpoint, as nickel powder can be used to form the magnetostrictive elements into various geometric shapes and sizes more easily compared to using solid nickel components in an optical preform.

Further, the magnetostrictive strain sensing capability of the fibers described herein can enhance or provide new sensing functionalities in intrinsic and extrinsic fiber optic sensing schemes, such as long-period gratings (LPGs), Brillouin Scattering, Rayleigh Scattering, Raman Scattering, Mach Zehnder Interferometers, Michelson Interferometers, Fabry-Perot Interferometers, fiber segment interferometry, single-point sensors, quasi-distributed (multiplexed) sensors, distributed sensors, FBG-based sensors, multi-parameter sensors, multi-material sensors, and other types of sensing schemes. Additionally, the optical core of the fibers can be inscribed in some cases as another mechanism for identifying the location or approximate location (i.e., localization) of a magnetic field. Similarly, the fibers can also allow for monitoring a specific magnetic field located at a certain position along the fiber.

Turning to the drawings, FIG. 1 illustrates a cross section of an example magnetic sensing optical fiber 100 ("fiber 100") according to various embodiments described herein. As shown, the fiber 100 includes a magnetostrictive region or a magnetostrictive element 103 of magnetostrictive material, an optical core 106, a cladding 109, and a coating 112. The fiber 100 is illustrated as a representative example in FIG. 1. The illustration of the fiber is not exhaustive, and the fiber 100 can include other components or elements in some cases, such as additional regions or elements of magnetostrictive materials in the cladding 109, jackets around the coating 112, and other elements.

The optical core 106 guides light in the fiber 100. As examples, the optical core 106 can be embodied as an optical waveguide that can be formed using glass, plastic, silica, polymer, a combination thereof, or other suitable materials that run along a length (i.e., into the page of FIG. 1) of the fiber 100. In one example, the optical core 106 can include germanium doped silica. In other examples, the optical core 106 can include pure fused silica, phosphorus doped silica, fluorine doped silica, chlorine doped silica, borosilicate glass, or another material. The optical core 106 is surrounded by the cladding 109. The cladding 109 can be embodied as a medium with a lower index of refraction than the optical core 106, such as a cladding of a different glass, plastic, silica, polymer, a combination thereof, or other materials. In one example, the cladding 109 can include fused silica. In other examples, the cladding 109 can include pure fused silica, phosphorus doped silica, fluorine doped silica, chlorine doped silica, borosilicate glass, or another material. Light travelling in or along the optical core 106 reflects at a boundary between the optical core 106 and the cladding 109 in the fiber 100, maintaining light in the optical core 106.

In one example, the fiber 100 can be fabricated to have a diameter of approximately 50-1,000 micrometers (μm), although other diameters can be relied upon, and drawn to a length of approximately 1 kilometer (km) or greater, although other lengths can be relied upon. The optical core 106 can be fabricated to have a diameter of approximately 1-15 μm, although other diameters can be relied upon. Additionally, the optical core 106 can extend along the length of the fiber 100 in a continuous manner.

In the example depicted in FIG. 1, the magnetostrictive element 103 has a cylindrical shape with a circular cross section, although other shapes can be relied upon. In this example, the magnetostrictive element 103 can be fabricated to have a diameter of approximately 1 nanometer (nm)–65 μm, although other diameters can be relied upon. In this example, the magnetostrictive element 103 can extend along the length of the fiber 100 in a continuous manner. However, in some cases, the magnetostrictive element 103 can be embodied as a collection of discrete magnetostrictive elements that can be spaced apart from one another along the length of the fiber 100 in a discontinuous or intermittent manner, for example, as described below and illustrated in FIG. 4.

Among others, the characteristics of the optical core 106 can be defined by the materials from which the optical core 106 is formed and the diameter or cross-sectional area of optical core 106. In various embodiments, the optical core 106 and the cladding 109 can be formed from a variety of materials used in fiber optic cables. The fiber 100 can also be embodied as a single mode optical fiber or a multimode optical fiber.

The magnetostrictive element 103 can be embodied as a region of magnetostrictive material that experiences magnetostriction in the presence of a magnetic field. In one example, the magnetostrictive element 103 can be embodied as a ferromagnetic nickel or nickel rod, although other magnetostrictive materials can be relied upon, such as Metglas®, Terfenol-D™, and other materials. In some examples, the magnetostrictive element 103 can be embodied as an alloy such as, for instance, at least one of an iron-cobalt (FeCo) alloy, a nickel-iron (NiFe) alloy, an iron-gallium alloy (galfenol), or another alloy. In another example, the magnetostrictive element 103 can be embodied as cobalt (Co). Both the optical core 106 and the magnetostrictive element 103 are surrounded by the cladding 109 along the length of the fiber 100.

Depending on the materials used to form the magnetostrictive element 103, the optical core 106, and the cladding 109, at least one of the magnetostrictive element 103 or the optical core 106 may or may not be coupled (e.g., bonded) to the cladding 109. As such, in some cases, an outer surface of at least one of the magnetostrictive element 103 or the optical core 106 is coupled (e.g., bonded) to an inner surface of the cladding 109. In other cases, an outer surface of at least one of the magnetostrictive element 103 or the optical core 106 is not coupled (e.g., bonded) to an inner surface of the cladding 109.

The fiber 100 can be used in various sensing applications, such as in sensing MWD and UOG sensing applications, among others, due to the magnetostrictive properties of the fiber 100. Magnetostriction is described as the distortion of the lattice exhibited by crystals when they are magnetically polarized. Mathematically, the magnetostriction coefficient $N_{ijkl}$ relates strain $X_{ij}$ to the square of the magnetization $I_k I_L$. The contracted matrix form of magnetostriction is described by $N_{mn} = N_{ijkl}$, where the tensor and matrix coefficients are related. More simply, the magnetostrictive strain can be represented by $\lambda = \Delta l / l$ which describes the magnetostrictive induced change in length $\Delta l$ over the original length of the material before magnetization. Although nickel has a generally lower magnetostriction compared to specifically engineered alloys such as Metglas®, nickel is both cost effective and desirable from an optical preform manufacturing standpoint.

Accordingly, when the fiber 100 is exposed to a magnetic field, and the magnetostrictive element 103 is magnetically polarized, the magnetostrictive element 103 can be subjected to a magnetostrictive strain and can change in shape or dimension. The change in shape or dimension of the magnetostrictive element 103 in the presence of a magnetic field is mechanically transferred within the fiber 100, including to the cladding 109 and the optical core 106. Thus, the magnetostrictive strain, which may be experienced to differing extents at various segments along the fiber 100, can distort or change the state of the polarization of light that travels through the fiber 100, allowing for sensing of magnetic fields. The magnitude of such distortion or change of the polarization state of the light can depend on the degree to which the magnetostrictive strain is imparted on the fiber 100 in a uniform or non-uniform manner. For instance, the more non-uniform the magnetostrictive strain is on the fiber 100, the greater the magnitude of the distortion of change of the polarization state of the light traveling in the optical core 106, and vice versa.

The above-described distortion or change of the polarization state of the light can be sensed (e.g., detected, monitored) using various techniques. In one example, a change in polarization state of light traveling in the optical core 106 can be detected by identifying a change in reflected wavelength, for example, by Bragg gratings that can be inscribed on the optical core. In another example, a change in polarization state of light traveling in the optical core 106 can be detected by identifying a change in phase, for example, by intrinsic Fabry Perot type structures. In another example, a change in polarization state of light traveling in the optical core 106 can be detected by identifying a change in the "amount of time" to traverse from the injection point of light into the fiber 100 to some predetermined reflection point in the fiber 100 (e.g., such as a damage point reflection or an end of the fiber 100).

As one control on the operating and sensing characteristics of the fiber 100, the magnetostrictive element 103 can be separated from the optical core 106 at a predetermined, selected separation distance "D". The separation distance "D" is measured from the outer peripheral surface of the magnetostrictive element 103 to the outer peripheral surface of the optical core 106 in the examples described herein, although the separation distance can also be measured from the center of the magnetostrictive element 103 to the center of the optical core 106 in other cases. The separation distance "D" can be selected by design. For example, a closer proximity of the magnetostrictive element 103 to the optical core 106 can increase the strain projected from the magnetostrictive element 103 onto the optical core 106. An evaluation of the separation distance "D" as a control on the operating and sensing characteristics of the fiber 100 is described in additional detail herein with reference to FIGS. 7A and 7B.

The fiber 100 can also include additional magnetostrictive regions or elements of magnetostrictive materials distributed in the cladding 109. As an example, FIG. 1 illustrates additional magnetostrictive regions or magnetostrictive elements 103a, 103b, 103c of magnetostrictive materials. The magnetostrictive elements 103, 103a, 103b, 103c can each be formed from the same type of magnetostrictive material in one example. However, one or more of the magnetostrictive elements 103, 103a, 103b, 103c can be formed from a different magnetostrictive material compared to any or all other magnetostrictive elements 103, 103a, 103b, 103c in some cases. Additionally, in other cases, the magnetostrictive elements 103, 103a, 103b, 103c can be formed from the same magnetostrictive materials but having different magnetic domains based on tailored magnetocrystalline anisotropy of the magnetostrictive elements 103, 103a, 103b, 103c, respectively.

In other examples, the magnetostrictive elements 103a, 103b, 103c can have the same or varying diameters as compared to each other and the magnetostrictive element 103. In addition, the magnetostrictive elements 103, 103a, 103b, 103c can be spaced at equal or varying distances (e.g., "D") from the optical core 106. For example, the magnetostrictive elements 103, 103a, 103b, 103c can be concentrically distributed (i.e., each positioned the same distance "D") around the optical core 106. In some cases, any or all of the magnetostrictive elements 103, 103a, 103b, 103c may be spaced less than or equal to approximately 10 nm from the optical core 106.

In the example depicted in FIG. 1, any or all of the magnetostrictive elements 103, 103a, 103b, 103c can extend along a length (i.e., into the page of FIG. 1) of the fiber 100 in a continuous manner. However, in some cases, one or more of the magnetostrictive elements 103, 103a, 103b, 103c can be respectively embodied as a collection of discrete magnetostrictive elements that can extend along a length (i.e., into the page of FIG. 1) of the fiber 100 in a discontinuous or intermittent manner, as described below and illustrated in FIG. 4.

The selection of the number and respective positions and shapes of the magnetostrictive elements 103, 103a, 103b, 103c in the fiber 100, among possibly others, can be tailored based on the desired sensing characteristics and application for the fiber 100. The number and respective positions and shapes of the magnetostrictive elements 103, 103a, 103b, 103c in the fiber 100 can be selected to affect certain parameters of light travelling in the fiber 100, such as the polarization state of the light, during sensing. For example, if the fiber 100 includes only the magnetostrictive element 103, the magnetostrictive element 103 may bend, elongate (or contract), or bend and elongate the fiber 100 in the presence of a magnetic field. If the fiber 100 includes only the magnetostrictive elements 103 and 103a (and they are formed from the same materials and to the same dimensions), which are positioned at opposite sides of the optical core 106, the magnetostrictive elements 103 and 103a may be more limited to only elongation and contraction of the fiber 100. If the fiber 100 includes only the magnetostrictive elements 103 and 103c or only the magnetostrictive elements 103 and 103b, other bending or elongating modes can be excited in the fiber 100, depending on the presence of a magnetic field.

Additionally, the fiber 100 can include intrinsic and extrinsic fiber optic sensing schemes. For example, the fiber 100 may be inscribed with fiber optic sensors such as, for instance, one or more FBGs or LPGs. When the fiber 100 is subjected to a magnetic field, the induced material strain on a fiber optic sensor such as, for instance, an FBG based interferometer can be used to monitor changes in the field strength as a function of time. A magnetic sensing system described herein can utilize optical interrogating technology, such as distributed acoustic sensing (DAS) technology, to interrogate the response of the fiber 100 in the presence of an external magnetic field, by monitoring the modulation of the refractive index, the change in fringe separation, and other varying response characteristics induced in the fiber 100 by the magnetostrictive element 103.

FIGS. 2A, 2B, 2C, 2D, and 2E each illustrate a cross section of another example magnetic sensing optical fiber according to at least one embodiment described herein. FIG. 2A illustrates a cross section of an example magnetic sensing optical fiber 200a ("fiber 200a"). FIG. 2B illustrates a cross section of an example magnetic sensing optical fiber 200b ("fiber 200b"). FIG. 2C illustrates a cross section of an example magnetic sensing optical fiber 200c ("fiber 200c"). FIG. 2D illustrates a cross section of an example magnetic sensing optical fiber 200d ("fiber 200d"). FIG. 2E illustrates a cross section of an example magnetic sensing optical fiber 200e ("fiber 200e").

Each of the fibers 200a, 200b, 200c, 200d, 200e is an example of an alternative embodiment of the fiber 100 described above with reference to FIG. 1. The difference between the fibers 200a, 200b, 200c, 200d, 200e and the fiber 100 is that each of the fibers 200a, 200b, 200c, 200d, 200e includes a magnetostrictive element having at least one of a cross section or a location within the cladding 109 that is different from that of the magnetostrictive element 103 in the cladding 109 of the fiber 100.

The fiber 200a includes a magnetostrictive element 203a having a square or rectangular shaped cross section. The fiber 200b includes a magnetostrictive element 203b having a hexagonal shaped cross section. The fiber 200c includes a magnetostrictive element 203c having a triangular shaped cross section. The fiber 200d includes a magnetostrictive element 203d having an elliptical shaped cross section. The fiber 200e includes a magnetostrictive element 203e having a ring or annular (i.e., doughnut) shaped cross section that allows the magnetostrictive element 203e to be formed around (i.e., circumferentially around) the optical core 106.

In the examples depicted in FIGS. 2A, 2B, 2C, 2D, and 2E, each of the magnetostrictive elements 203a, 203b, 203c, 203d, 203e can extend along a length (i.e., into the page of the respective FIG. 2A, 2B, 2C, 2D, 2E) of the fibers 200a, 200b, 200c, 200d, 200e, respectively. In these examples, each of the magnetostrictive elements 203a, 203b, 203c, 203d, 203e can be formed using any of the above-described materials that can be used to form the magnetostrictive element 103.

In the presence of a magnetic field, each of the magnetostrictive elements 203a, 203b, 203c, 203d, 203e may bend and/or elongate (or contract) its respective fiber 200a, 200b, 200c, 200d, 200e in a manner that is different from how the magnetostrictive element 103 may bend and/or elongate (or contract) the fiber 100 in the presence of a magnetic field. Consequently, each of the magnetostrictive elements 203a, 203b, 203c, 203d, 203e can affect the polarization state of light travelling in its respective fiber 200a, 200b, 200c, 200d, 200e in a manner that is different from how the magnetostrictive element 103 can affect the polarization state of light travelling in the fiber 100. In this way, the different shaped cross section of each of the magnetostrictive elements 203a, 203b, 203c, 203d, 203e, compared to that of the magnetostrictive element 103, can allow for each corresponding fiber 200a, 200b, 200c, 200d, 200e to have at least one of sensing characteristics or applications that are different from that of the fiber 100.

Figures 3A, 3B, 3C, 3D, 3E:
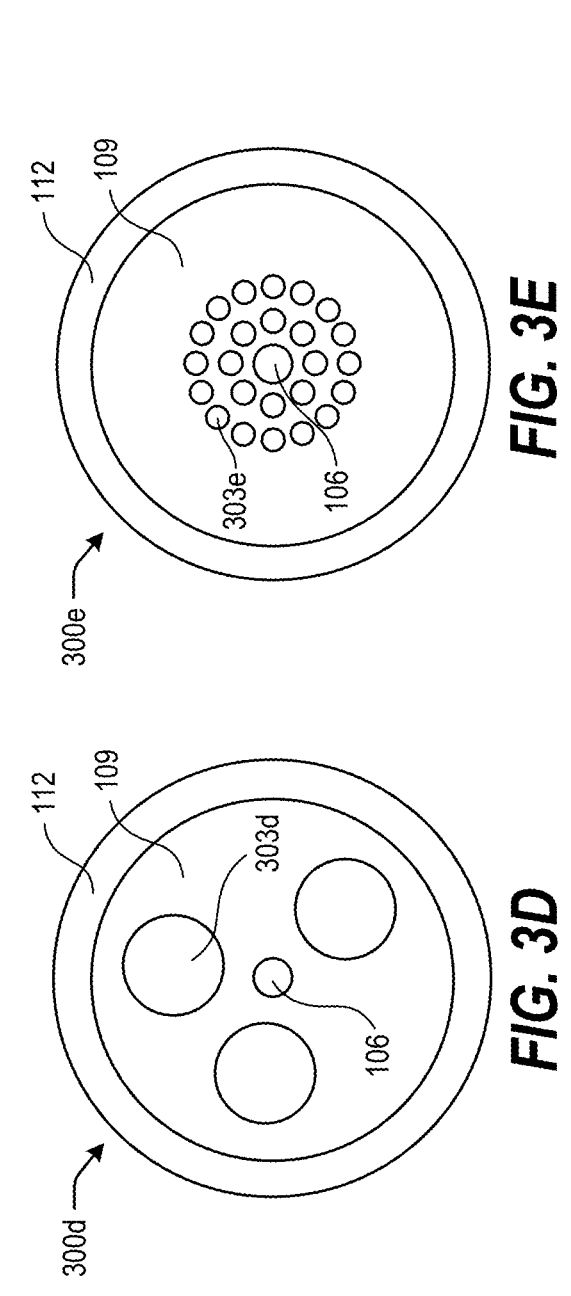
FIG. 3A illustrates a cross section of another example magnetic sensing optical fiber according to at least one embodiment described herein.
FIG. 3B illustrates a cross section of another example magnetic sensing optical fiber according to at least one embodiment described herein.
FIG. 3C illustrates a cross section of another example magnetic sensing optical fiber according to at least one embodiment described herein.
FIG. 3D illustrates a cross section of another example magnetic sensing optical fiber according to at least one embodiment described herein.
FIG. 3E illustrates a cross section of another example magnetic sensing optical fiber according to at least one embodiment described herein.

FIGS. 3A, 3B, 3C, 3D, and 3E each illustrate a cross section of another example magnetic sensing optical fiber according to at least one embodiment described herein. FIG. 3A illustrates a cross section of an example magnetic sensing optical fiber 300a ("fiber 300a"). FIG. 3B illustrates a cross section of an example magnetic sensing optical fiber 300b ("fiber 300b"). FIG. 3C illustrates a cross section of an example magnetic sensing optical fiber 300c ("fiber 300c"). FIG. 3D illustrates a cross section of an example magnetic sensing optical fiber 300d ("fiber 300d"). FIG. 3E illustrates a cross section of an example magnetic sensing optical fiber 300e ("fiber 300e").

Each of the fibers 300a, 300b, 300c, 300d, 300e is an example of an alternative embodiment of the fiber 100 described above with reference to FIG. 1. The difference between the fibers 300a, 300b, 300c, 300d, 300e and the fiber 100 is that each of the fibers 300a, 300b, 300c, 300d, 300e includes at least one of a quantity, a diameter, a location, or an arrangement of magnetostrictive elements in the cladding 109 that is different from that of the magnetostrictive elements 103, 103a, 103b, 103c in the cladding 109 of the fiber 100.

As illustrated in FIG. 3A, the fiber 300a includes a square bundled system of nine magnetostrictive elements 303a (collectively, "the magnetostrictive elements 303a") positioned on one side of the optical core 106 (only a single magnetostrictive element 303a is denoted in FIG. 3A for clarity). The magnetostrictive elements 303a can extend along a length (i.e., into the page of FIG. 3A) of the fiber 300a. Any or all of the magnetostrictive elements 303a can be formed using one or more of the above-described materials that can be used to form the magnetostrictive element 103, or another material in some cases. While the example depicted in FIG. 3A includes nine of the magnetostrictive elements 303a, any number greater or less than nine can be relied upon in some cases.

As illustrated in FIG. 3B, the fiber 300b includes a circular bundled system of eight magnetostrictive elements 303b (collectively, "the magnetostrictive elements 303b") positioned around (i.e., circumferentially around) the optical core 106 (only a single magnetostrictive element 303b is denoted in FIG. 3B for clarity). The magnetostrictive elements 303b can extend along a length (i.e., into the page of FIG. 3B) of the fiber 300b. Any or all of the magnetostrictive elements 303b can be formed using one or more of the above-described materials that can be used to form the magnetostrictive element 103, or another material in some cases. While the example depicted in FIG. 3B includes eight of the magnetostrictive elements 303b, any number greater or less than eight can be relied upon in some cases.

As illustrated in FIG. 3C, the fiber 300c includes two symmetric magnetostrictive elements 303c (collectively, "the magnetostrictive elements 303c") that are each positioned on one side of the optical core 106 (only a single magnetostrictive element 303c is denoted in FIG. 3C for clarity). The magnetostrictive elements 303c can extend along a length (i.e., into the page of FIG. 3C) of the fiber 300c. Either or both of the magnetostrictive elements 303c can be formed using one or more of the above-described materials that can be used to form the magnetostrictive element 103, or another magnetostrictive material in some cases. While the example depicted in FIG. 3C includes two of the magnetostrictive elements 303c, any number greater than two can be relied upon in some cases.

As illustrated in FIG. 3D, the fiber 300d includes three asymmetric magnetostrictive elements 303d (collectively, "the magnetostrictive elements 303d") that are positioned around (i.e., circumferentially) the optical core 106 (only a single magnetostrictive element 303d is denoted in FIG. 3D for clarity). The magnetostrictive elements 303d can extend along a length (i.e., into the page of FIG. 3D) of the fiber 300d. Any or all of the magnetostrictive elements 303d can be formed using one or more of the above-described materials that can be used to form the magnetostrictive element 103, or another magnetostrictive material in some cases. While the example depicted in FIG. 3D includes three of the magnetostrictive elements 303d, any number greater or less than three can be relied upon in other cases.

As illustrated in FIG. 3E, the fiber 300e includes a circular bundled system of twenty-four magnetostrictive elements 303e (collectively, "the magnetostrictive elements 303e") positioned around (i.e., circumferentially) the optical core 106 (only a single magnetostrictive element 303e is denoted in FIG. 3E for clarity). The magnetostrictive elements 303e can extend along a length (i.e., into the page of FIG. 3E) of the fiber 300e. Any or all of the magnetostrictive elements 303e can be formed using one or more of the above-described materials that can be used to form the magnetostrictive element 103, or another magnetostrictive material in some cases. While the example depicted in FIG. 3E includes twenty-four of the magnetostrictive elements 303e, any number greater or less than twenty-four can be relied upon.

In the presence of a magnetic field, each set of the magnetostrictive elements 303a, 303b, 303c, 303d, 303e may collectively bend and/or elongate (or contract) their respective fiber 300a, 300b, 300c, 300d, 300e in a manner that is different from how the magnetostrictive elements 103, 103a, 103b, 103c may collectively bend and/or elongate (or contract) the fiber 100 in the presence of a magnetic field. Consequently, each set of the magnetostrictive elements 303a, 303b, 303c, 303d, 303e can collectively affect the polarization state of light travelling in their respective fiber 300a, 300b, 300c, 300d, 300e in a manner that is different from how the magnetostrictive elements 103, 103a, 103b, 103c can collectively affect the polarization state of light travelling in the fiber 100. In this way, the different quantity, diameter, location, and/or an arrangement of the magnetostrictive elements 303a, 303b, 303c, 303d, 303e in the cladding 109, compared to that of the magnetostrictive elements 103, 103a, 103b, 103c, can allow for each corresponding fiber 300a, 300b, 300c, 300d, 300e to have at least one of sensing characteristics or applications that are different from that of the fiber 100.

Figure 4:
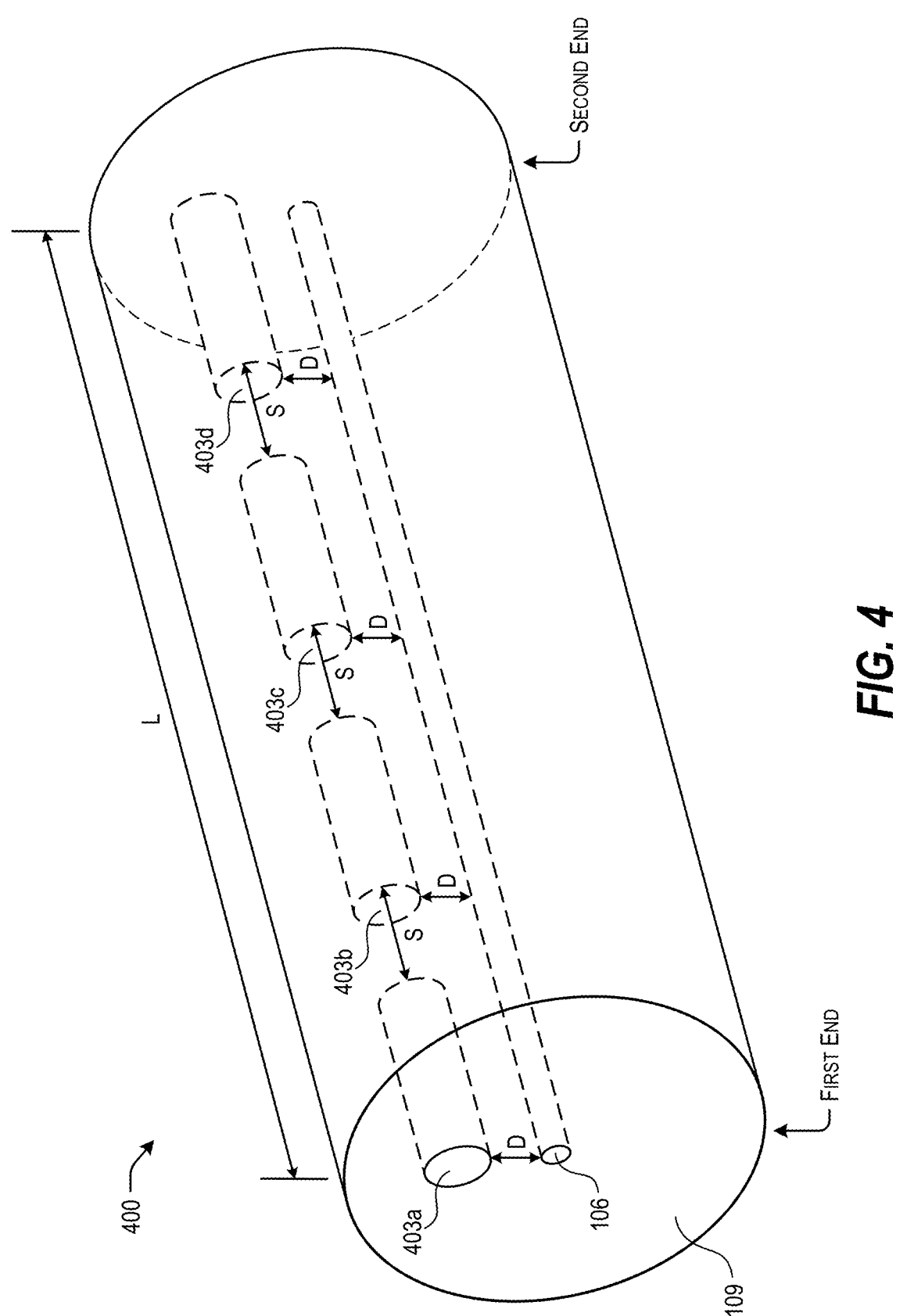
FIG. 4 illustrates a perspective view of another example magnetic sensing optical fiber according to at least one embodiment described herein.

FIG. 4 illustrates a perspective view of another example magnetic sensing optical fiber 400 ("fiber 400") according to at least one embodiment described herein. The fiber 400 is an example of an alternative embodiment of the fiber 100 described above with reference to FIG. 1. The difference between the fiber 400 and the fiber 100 is that the fiber 400 includes a plurality of discrete (e.g., separated) magnetostrictive elements 403a, 403b, 403c, 403d (collectively, "discrete magnetostrictive elements 403a, 403b, 403c, 403d") that are adjacent to the optical core 106 and spaced apart from one another in the cladding 109 at different locations along the fiber 400. In contrast, in the example depicted in FIG. 1, any or all of the magnetostrictive elements 103, 103a, 103b, 103c can extend along an entire length (i.e., into the page of FIG. 1) of the fiber 100 in a continuous manner. For clarity, the coating 112 is omitted from the example depicted in FIG. 4. However, in some cases the fiber 400 can include the coating 112 wrapped circumferentially around the cladding 109 in the same or similar manner as illustrated in FIG. 1 with reference to the fiber 100.

Although there are four of the discrete magnetostrictive elements 403a, 403b, 403c, 403d depicted in FIG. 4, another quantity that is greater or less than four may be relied upon in some cases. Additionally, while each of the discrete magnetostrictive elements 403a, 403b, 403c, 403d is depicted as a cylinder in FIG. 4, another shape may be relied upon for any or all of the discrete magnetostrictive elements 403a, 403b, 403c, 403d in some cases. In the example depicted in FIG. 4, the discrete magnetostrictive elements 403a, 403b, 403c, 403d have the same approximate size. In this example, the discrete magnetostrictive elements 403a, 403b, 403c, 403d have the same approximate diameter and length. In other examples, the discrete magnetostrictive elements 403a, 403b, 403c, 403d can have varying sizes as compared to each other. In addition, the discrete magnetostrictive elements 403a, 403b, 403c, 403d can be formed using the same or varying materials as compared to each other.

In the example illustrated in FIG. 4, each of the discrete magnetostrictive elements 403a, 403b, 403c, 403d is positioned parallel to the optical core 106 at different locations along a length ("L") of the fiber 400 between a first and second end of the fiber 400. For instance, each of the discrete magnetostrictive elements 403a, 403b, 403c, 403d is positioned in the cladding 109 such that its longitudinal axis is parallel to that of the optical core 106 along the length "L" of the fiber 400 in this example. In another example, one or more of the discrete magnetostrictive elements 403a, 403b, 403c, 403d can be positioned in a different orientation with respect to the optical core 106. For instance, in some cases, at least one of the discrete magnetostrictive elements 403a, 403b, 403c, 403d can be positioned in the cladding 109 such that its longitudinal axis is perpendicular or oblique to that of the optical core 106.

In some examples, the discrete magnetostrictive elements 403a, 403b, 403c, 403d can be formed in the cladding 109 as a first group of magnetostrictive elements that can be collectively positioned at a particular longitudinal section along the length "L" of the fiber 400. In these examples, a second group of additional discrete magnetostrictive elements 403a, 403b, 403c, 403d can be formed in the cladding 109 at one or more other longitudinal sections along the length "L" of the fiber 400. In these examples, there can be one or more longitudinal sections of the cladding 109 along the "L" of the fiber 400 in which a group of the discrete magnetostrictive elements 403a, 403b, 403c, 403d are included and one or more other longitudinal sections of the cladding 109 along the "L" of the fiber 400 in which the discrete magnetostrictive elements 403a, 403b, 403c, 403d are omitted.

The discrete magnetostrictive elements 403a, 403b, 403c, 403d can be spaced at equal or varying distances (e.g., "D") from the optical core 106 along at least a portion of the length of the fiber 400 between the first and second end of the fiber 400. In one example, the discrete magnetostrictive elements 403a, 403b, 403c, 403d can be spaced equidistantly from the optical core 106. For instance, each of the discrete magnetostrictive elements 403a, 403b, 403c, 403d can be spaced less than or equal to approximately 10 μm from the optical core 106 in this example. In another example, one or more first discrete magnetostrictive elements 403a, 403b, 403c, 403d and one or more second discrete magnetostrictive elements 403a, 403b, 403c, 403d can be spaced at different distances from the optical core 106.

In addition, the discrete magnetostrictive elements 403a, 403b, 403c, 403d can be spaced at equal or varying distances (e.g., "S") from one another along at least a portion of the length "L" of the fiber 400 between the first and second end of the fiber 400. In one example, the discrete magnetostrictive elements 403a, 403b, 403c, 403d can be spaced equidistantly from one another along the length "L" of the fiber 400. In another example, one or more first discrete magnetostrictive elements 403a, 403b, 403c, 403d and one or more second discrete magnetostrictive elements 403a, 403b, 403c, 403d can be spaced at different distances from one another along the length "L" of the fiber 400.

In some examples, each of the discrete magnetostrictive elements 403a, 403b, 403c, 403d can be positioned on the same side of the optical core 106. In other examples, one or more of the discrete magnetostrictive elements 403a, 403b, 403c, 403d can be positioned on one side of the optical core 106 and one or more other discrete magnetostrictive elements 403a, 403b, 403c, 403d can be positioned on a different side (e.g., an opposite side) of the optical core 106.

In one example, each of the discrete magnetostrictive elements 403a, 403b, 403c, 403d can be positioned coaxially on one side of the optical core 106 along the fiber 400, for instance, as illustrated in FIG. 4. In another example, at least one of the discrete magnetostrictive elements 403a, 403b, 403c, 403d can be positioned in the cladding 109 such that its longitudinal axis is offset from (i.e., not aligned with) that of one or more other discrete magnetostrictive elements 403a, 403b, 403c, 403d. For instance, at least one of the discrete magnetostrictive elements 403a, 403b, 403c, 403d can be positioned on one side of the optical core 106 in the cladding 109 such that its longitudinal axis is offset from (i.e., not aligned with) that of one or more other discrete magnetostrictive elements 403a, 403b, 403c, 403d that are also positioned on the same side of the optical core 106. Various arrangements of the discrete magnetostrictive elements 403a, 403b, 403c, 403d, or different groups thereof, in the cladding 109 are envisioned and included within the scope of the present disclosure.

In some cases, the fiber 400 can be formed according to a particular combination of various design specifications for the discrete magnetostrictive elements 403a, 403b, 403c, 403d. Examples of such design specifications can include, but are not limited to, the shape, size, material, orientation, distance ("D") from the optical core 106, and spacing ("S") between the discrete magnetostrictive elements 403a, 403b, 403c, 403d, as well as spacing between different groups of the discrete magnetostrictive elements 403a, 403b, 403c, 403d that can be positioned at different longitudinal sections along the length "L" of the fiber 400 in some cases. In one example, the fiber 400 can be formed using a particular combination of such design specifications that will allow for the fiber 400 to have at least one of a desired optical, operating, or sensing characteristic or application.

It should be appreciated that any or all of the magnetostrictive elements described herein can be respectively embodied as a collection of individual (i.e., discrete, independent) magnetostrictive elements in some cases. For instance, in some cases, any or all of the magnetostrictive elements described herein can be respectively embodied as a collection of individual magnetostrictive elements in the same or similar manner as the discrete magnetostrictive elements 403a, 403b, 403c, 403d of the fiber 400. In some examples, any or all of the above-described magnetostrictive elements 103, 103a, 103b, 103c, 203a, 203b, 203c, 203d, 203e, 303a, 303b, 303c, 303d, 303e can be respectively embodied as a collection of individual magnetostrictive elements in the same or similar manner as the discrete magnetostrictive elements 403a, 403b, 403c, 403d of the fiber 400.

Figure 5:
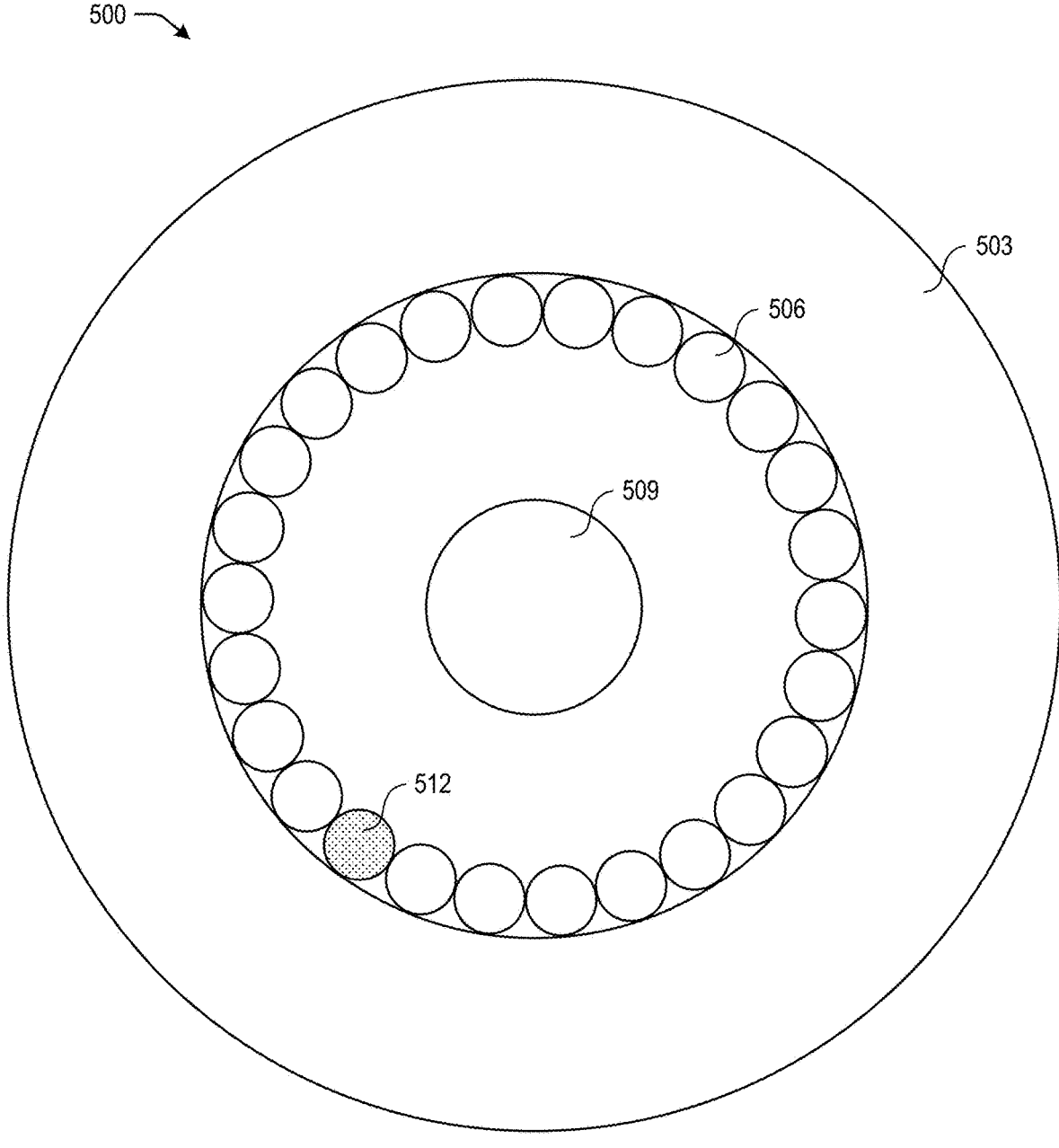
FIG. 5 illustrates a cross section of an example preform for manufacturing a magnetic sensing optical fiber according to various embodiments described herein.

FIG. 5 illustrates a cross section of an example preform 500 for manufacturing a magnetic sensing optical fiber according to various embodiments described herein. Optical preforms according to the embodiments can be fabricated through a stacking method, where tubes, rods, and powders can be included in a sleeve tube. For example, FIG. 5 shows a cross section of the preform 500 with a silica tube 503, a plurality of silica rods 506 (collectively, "silica rods 506") that are distributed around a silica preform with a doped silica core 509, and nickel powder that is filled in tube 512. Only one of the silica rods 506 is denoted in FIG. 5 for clarity. Production of a stable waveguide can require a wall thickness of approximately 1 millimeter (mm) or greater for the silica tube 503 according to one embodiment. Inside of the silica tube 503, the silica rods 506 and the tube 512 with nickel powder are concentrically arranged around the doped silica core 509 in this example. The doped silica core 509 includes a germanium doped optical core in the center region that is surrounded by silica material in this example.

During the fiber-draw process, the nickel powder in the tube 512 can melt and solidify into a nickel cylinder or rod, to form the magnetostrictive element 103 shown in FIG. 1, for example. Additionally, during the fiber-draw process, at least one of the silica tube 503 or the silica rods 506 can melt and solidify to form the cladding 109 shown in FIG. 1, for example. In some embodiments, nickel rods may be relied upon in the preform stage rather than nickel powder, which could also form, for example, the magnetostrictive element 103. However, using nickel powder can offer various manufacturing advantages over using nickel rods in the preform stage. Although FIG. 5 illustrates a single tube 512 that has been filled with nickel powder, any number of tubes with nickel powder or other magnetostrictive materials may be arranged around the doped silica core 509 depending on the number of magnetostrictive elements that are desired in a fabricated optical fiber. Alternatively, other ferromagnetic powders or rods, such as powders or rods with Metglas® or Terfenol-D™, may be included in the silica tube 503 in combination with the tube 512 with nickel powder, or in replacement of the tube 512 with nickel powder.

Manufacturing of the multi-material waveguides can change depending on at least one of the type (e.g., material) or the structure (e.g., shape, dimensions) of one or more magnetostrictive elements that are to be included in a fabricated optical fiber. Powders, rods, and ribbons have all been investigated and each can influence the fiber-draw process. The preform specifications detailed above can result in a consistent 200-250 μm final fiber diameter and 8 μm single mode optic core diameter at more than 1 km draw lengths.

In one example, a full-scale, three story, fiber draw tower can be used to fabricate the fiber 100 from the preform 500. In this example, optical fiber fabrication can take the following steps. First, the draw tower furnace can be heated to approximately 2000 degrees Celsius (° C.), so that the front non-stacked portion of the preform 500 begins to soften and descend with the help of a mechanical downwards force. A capstan and take-up can collect the drawn fiber and spool it automatically up to 1 km per preform. Multi-material melting point differences in the fused silica cladded ferromagnetic system should be a consideration in this fiber draw process. Successful completion of a multi-material fiber draw can be affected by the vapor pressure, melting point, or boiling point of the material, which can dictate if the fiber draw is possible. Upon discovering a compatible ratio of vapor pressures, the fiber can be drawn assuming a neck-down region contains metal. Without a neck-down region containing metal, the draw may pull from the cladding instead of the optical core, thereby pushing the metal upwards resulting in a failed draw. This phenomenon may be affected by a combination of multi-material surface tension and melting points.

FBG inscription of the optical core 106 in any optical fiber described herein (e.g., the fiber 100) can be performed with an ultraviolet (UV) laser or a femtosecond laser, which can be beneficial due to the zero thermal effect, resulting in higher inscription precision. A point-by-point method can be used to inscribe Type II FBGs in the fiber 100, as one example. In some cases, an optical system (e.g., a femtosecond laser set-up) that uses an external shutter to control the onset light beam can be used to perform FBG inscription of the optical core 106. Steering mirrors can be used to alter the beam to any direction in three-dimensional (3D) space. Beam direction can be fixed by two irises placed along the optical beam path. A half wave plate (HWP) and polarization beam splitter (PBS) can be used to change the optical power of the linearly polarized beam, while a neutral density filter wheel can be used for laser power control. A periscope, composed of two mirrors, can direct the laser beam onto an in-line monitor subsystem. FBG inscription can require a precise degree of rotation such that an optical fiber can be positioned in an efficient manner.

Six stages can be included in the femtosecond laser set-up according to one or more embodiments: an applied Scientific Instrument 3D stage, Physiks Instrument piezo stage, PI M126 stage, two Thorlabs™ rotation stages, and a New-port™ ESP300 controlled stage. All stages can yield a 0.1 μm accuracy excluding the piezo stage which is capable of nanometer (nm) levels of accuracy. In some examples, a graphical programming environment such as, for instance, LabVIEW® programing can be used to control all external shutters, stages, and moveable components. In one example, Bragg wavelength and grating period were measured to be 529 nm and 900 nm, respectively.

In some cases, any of the magnetic sensing optical fibers described herein can be fabricated in a manner other than using the preform 500 and stacking method described above. For instance, in some cases, the cladding 109 can be formed to a diameter size that allows for drilling of one or more channels or tunnels through the cladding 109. In these cases, one of such channels or tunnels can be drilled to a size that allows for insertion of the optical core 106 and one or more other channels or tunnels can each be drilled to a size that allows for insertion of a magnetostrictive element 103. Once drilled, the optical core 106 can be inserted into one of such channels or tunnels formed in the cladding 109 and a magnetostrictive element 103 can be inserted into any or all of the other channels or tunnels formed in the cladding 109.

Figure 6:
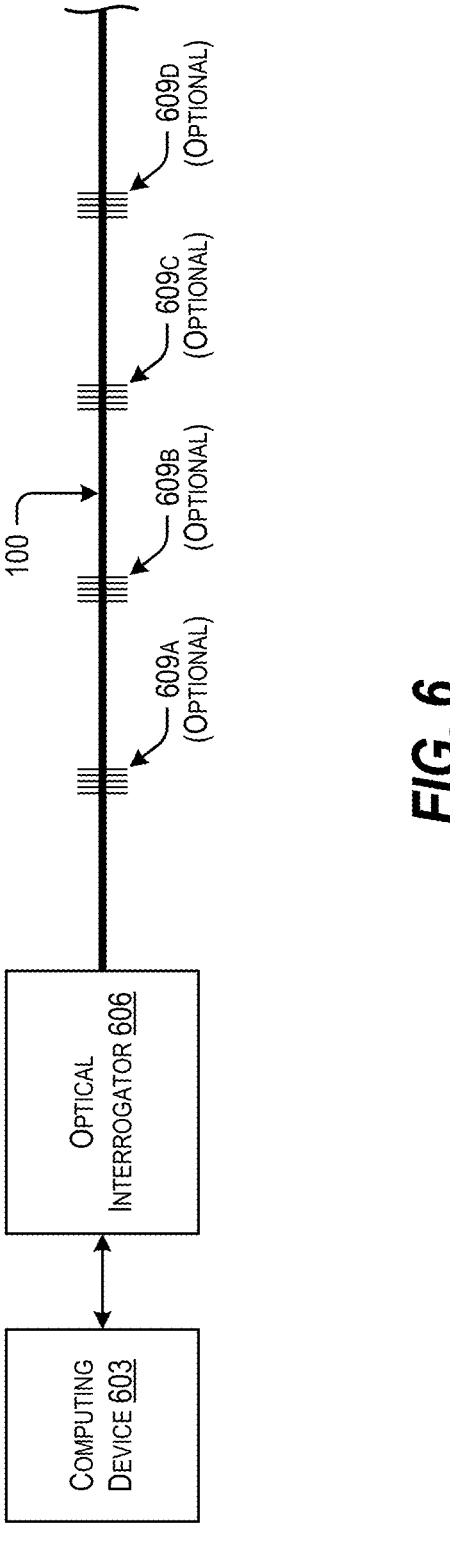
FIG. 6 illustrates a block diagram of an example magnetic sensing system according to at least one embodiment described herein.

FIG. 6 illustrates a block diagram of an example magnetic sensing system 600 ("system 600") according to at least one embodiment described herein. In the example depicted in FIG. 6, the system 600 includes a computing device 603 coupled to an optical interrogator 606 that is coupled to the fiber 100, although the system 600 can include other components in some cases. The computing device 603 can be embodied as, for instance, a computer, a laptop, a tablet, a smartphone, another computer device, or a combination thereof. The computing device 603 can be configured to operate the optical interrogator 606 as described herein.

As described above with reference to FIG. 1, in some cases, the fiber 100 can include intrinsic and extrinsic fiber optic sensing schemes. In the example illustrated in FIG. 6, the fiber 100 can (optionally) be inscribed with four fiber optic sensors 609a, 609b, 609c, 609d (collectively, "fiber optic sensors 609a, 609b, 609c, 609d"), although another quantity that is greater or less than four can be relied upon in some cases. In this example, the fiber optic sensors 609a, 609b, 609c, 609d can be spaced approximately 10 mm or more from one another along a length of the fiber 100, although a different spacing distance can be relied upon in some cases. In one example, any or all of the fiber optic sensors 609a, 609b, 609c, 609d can be embodied as an FBG. In another example, any or all of the fiber optic sensors 609a, 609b, 609c, 609d can be embodied as an LPG. Each of the fiber optic sensors 609a, 609b, 609c, 609d may also be referred to as a "channel." In some cases, the fiber optic sensors 609a, 609b, 609c, 609d can be omitted from the fiber 100 of the system 600.

The system 600 can utilize optical interrogating technology such as, for instance, distributed acoustic sensing (DAS) to interrogate the response of the fiber 100 to any external magnetic field by monitoring the modulation of the refractive index and the decrease in fringe separation with the fiber 100 elongation induced by the magnetostrictive element 103. When the fiber 100 is subjected to a magnetic field, the induced material strain on an FBG based interferometer that can be included in the system 600 in some cases can be used to monitor changes in the field strength as a function of time.

To interrogate the response of the fiber 100 to an external magnetic field, the optical interrogator 606 can be configured to transmit light into the fiber 100. For instance, the optical interrogator 606 can transmit the light into the fiber 100 such that the light travels along the optical core 106 and passes one or more of the fiber optic sensors 609a, 609b, 609c, 609d when such sensor(s) are inscribed on the optical core 106. When the fiber 100 is subjected to the external magnetic field, the magnetic field can induce a magneto-strictive strain on the magnetostrictive element 103. The magnetostrictive strain induced on the magnetostrictive element 103 can cause the magnetostrictive element 103 to change shape or dimensions and effectively move (e.g., vibrate, bend, twist, expand, or contract). The kinetic energy associated with such movement can transfer to the optical core 106, thereby inducing a certain level of strain in the optical core 106. This strain can cause one or more sections of the optical core 106 and/or one or more of the fiber optic sensors 609a, 609b, 609c, 609d to move (e.g., vibrate, bend, twist, expand, or contract). The movement of any section of the optical core 106 and/or any of the fiber optic sensors 609a, 609b, 609c, 609d can distort the polarization of the light transmitted into the fiber 100 by the optical interrogator 606.

In response to such strain induced movement described above, a section of the optical core 106 and/or one or more of the fiber optic sensors 609a, 609b, 609c, 609d can reflect (e.g., backscatter) at least a portion of the transmitted light back to the optical interrogator 606. The optical interrogator 606 can be configured to detect such light reflections. The computing device 603 can be configured to measure and monitor the strain induced in the fiber 100 based on the light reflections detected by the optical interrogator 606. By measuring and monitoring the changes in such strain over a period of time, the computing device 603 can confirm the presence of the external magnetic field adjacent to the fiber 100. Additionally, the computing device 603 can also determine the intensity and/or the location or approximate location of the magnetic field by identifying which section of the optical core 106 and/or which of the fiber optic sensors 609a, 609b, 609c, 609d reflected the light reflections.

In one example, the computing device 603 can be configured to measure the strain as a function of time delay associated with the light that passes through the optical core 106. For instance, the computing device 603 can measure the strain as a function of a time difference between when the light is transmitted into the optical core 106 and when the light reflections are detected. In another example, the computing device 603 can be configured to measure the strain as a function of wavelength shift of the light that passes through the optical core 106. For instance, the computing device 603 can measure the strain as a function of a wavelength difference between the wavelength of the transmitted light and the wavelength of the light reflections. In some cases, the computing device 603 can be configured to measure the strain based on a light scattering technique such as, for instance, Rayleigh scattering, Brillouin scattering, Raman scattering, another light scattering technique, or a combination thereof. In some cases, the computing device 603 can measure the strain using at least one of a Mach Zehnder interferometer, a Michelson interferometer, a Fabry-Perot interferometer, a single-point sensor, a quasi-distributed (multiplexed) sensor, or a distributed sensor.

In another example, the system 600 can interrogate the response of the fiber 100 by combining the use of FBGs and a time-division-multiplexing (TDM) signal processing scheme. For example, the optical interrogator 606 can include a distributed feedback laser diode that can serve as the source and can be operated (e.g., via the computing device 603 and/or the optical interrogator 606) in a pulse mode by direct laser current modulation. The light from the laser can be amplified by an erbium-doped fiber amplifier (EDFA) included in the optical interrogator 606. A narrow bandpass optical filter of the optical interrogator 606 can be used to suppress the amplified stimulated emission noise from the EDFA. The laser pulse can then propagate through a 3-port optical circulator included in the optical interrogator 606 to the fiber 100. The pulse can be partially reflected by one or more sections of the optical core 106 and/or one or more of the fiber optic sensors 609a, 609b, 609c, 609d, which can be embodied and implemented as FBGs in this example. The reflections can be routed by the optical circulator to a photodetector included in the optical interrogator 606. After being amplified by the electronic amplifier, the signals can be digitized by an analog-to-digital (A/D) converter included in the optical interrogator 606. The outputs from the A/D can be processed by a high-speed field-programmable gate array (e.g., a processor) that can be included in the computing device 603.

Figures 7A, 7B:
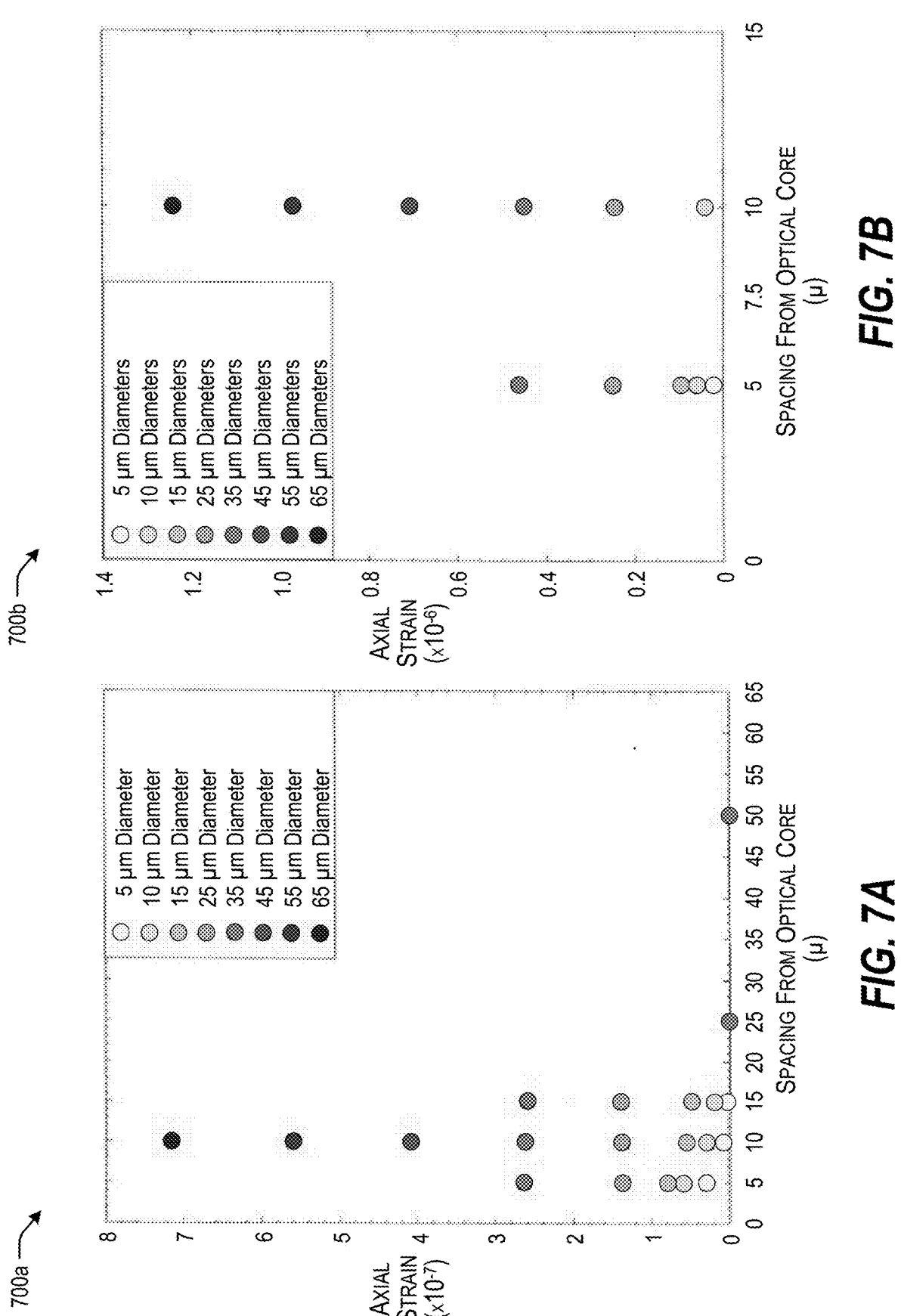
FIG. 7A illustrates an example strain versus spacing dot plot according to at least one embodiment described herein.
FIG. 7B illustrates another example strain versus spacing dot plot according to at least one embodiment described herein.

FIG. 7A illustrates an example strain versus spacing dot plot 700a according to at least one embodiment described herein. The dot plot 700a includes axial strain values for the fiber 100 that are plotted as functions of the diameter of a single magnetostrictive element 103 and the spacing (i.e., "D") of the magnetostrictive element 103 from the optical core 106. As demonstrated by the dot plot 700a, when the fiber 100 includes a single magnetostrictive element 103, the strain sensitivity of the fiber 100 can be increased by increasing the diameter of the magnetostrictive element 103 and reducing the spacing (i.e., "D") between the magneto-strictive element 103 and the optical core 106.

FIG. 7B illustrates another example strain versus spacing dot plot 700b according to at least one embodiment described herein. The dot plot 700b includes axial strain values for the fiber 100 that are plotted as functions of the diameter of each of the magnetostrictive elements 103, 103a and the spacing (i.e., "D") of each of the magnetostrictive elements 103, 103a from the optical core 106. As demonstrated by the dot plot 700a, when the fiber 100 includes the magnetostrictive elements 103, 103a, the strain sensitivity of the fiber 100 can be increased by increasing the diameter of each of the magnetostrictive elements 103, 103a and reducing the spacing (i.e., "D") between each of the magneto-strictive elements 103, 103a and the optical core 106.

Figure 8:
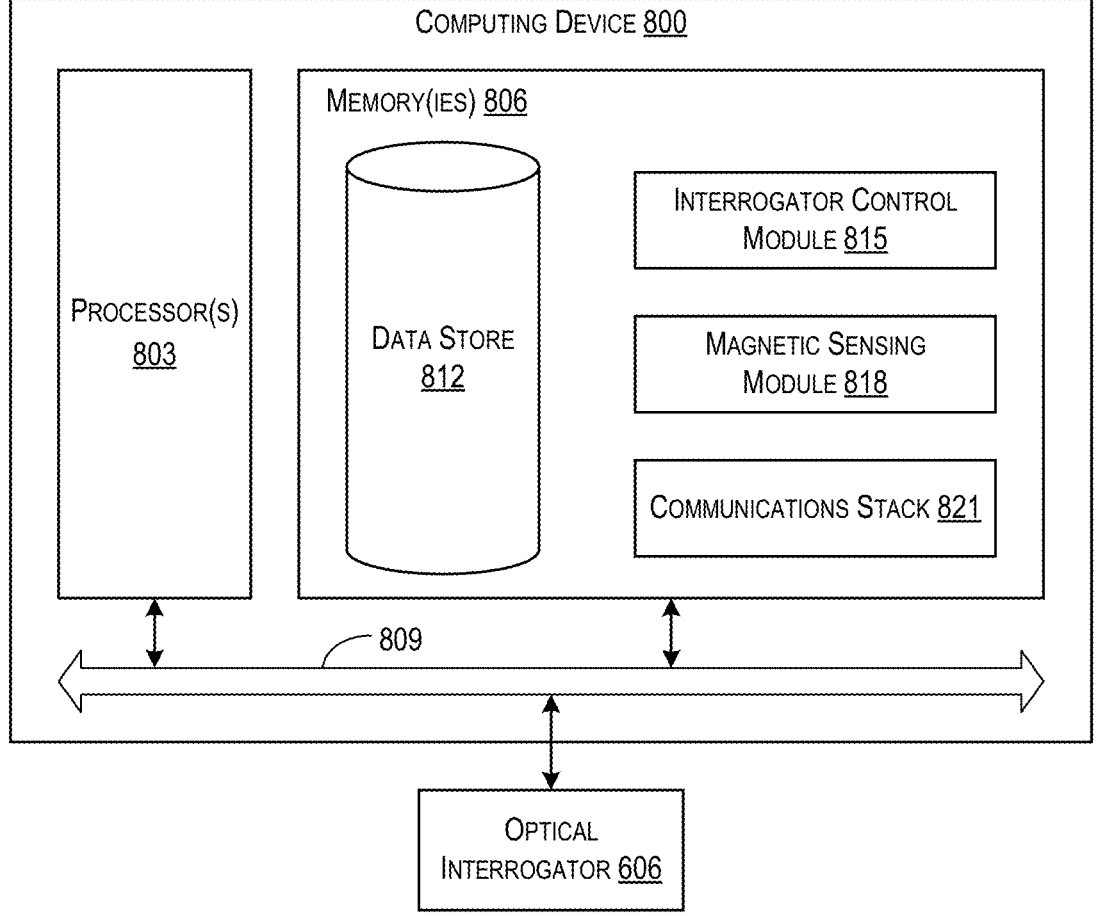
FIG. 8 illustrates a block diagram of an example computing device according to at least one embodiment described herein.

FIG. 8 illustrates a block diagram of an example computing device 800 according to at least one embodiment described herein. The computing device 800 can be embodied or implemented, at least in part, to sense (e.g., detect, monitor) an external magnetic field adjacent to any of the optical fibers described herein. In one example, the computing device 800 can be embodied or implemented, at least in part, as the computing device 603 described above with reference to FIG. 6. In this example, the computing device 800 can be used to control the optical interrogator 606. In this example, the computing device 800 can be used to sense (e.g., detect, monitor) an external magnetic field adjacent to the fiber 100.

The computing device 800 can include at least one processing system, for example, having at least one processor 803 and at least one memory 806, both of which can be coupled (e.g., communicatively, electrically, operatively) to a local interface 809. The memory 806 can include a data store 812, an interrogator control module 815, a magnetic sensing module 818, and a communications stack 821 in the example shown. The computing device 800 can be coupled to the optical interrogator 606 in this example. The computing device 800 can also include other components that are not illustrated in FIG. 8. In some cases, the computing device 800 may or may not include all the components illustrated in FIG. 8. For example, in some cases, depending on how the computing device 800 is embodied or implemented, the memory 806 may or may not include at least one of the interrogator control module 815, the magnetic sensing module 818, or other components.

The processor 803 can include any processing device (e.g., a processor core, a microprocessor, an application specific integrated circuit (ASIC), a field-programmable gate array (FPGA), a controller, a microcontroller, or a quantum processor) and can include one or multiple processors that can be operatively connected. In some examples, the processor 803 can include one or more complex instruction set computing (CISC) microprocessors, one or more reduced instruction set computing (RISC) microprocessors, one or more very long instruction word (VLIW) microprocessors, or one or more processors that are configured to implement other instruction sets.

The memory 806 can be embodied as one or more memory devices and store data and software or executable-code components executable by the processor 803. For example, the memory 806 can store executable-code components associated with the interrogator control module 815, the magnetic sensing module 818, and the communications stack 821 for execution by the processor 803. The memory 806 can also store data such as the data described below that can be stored in the data store 812, among other data.

In one example, the memory 806 can also store information to facilitate the sensing of an external magnetic field adjacent to an optical fiber described herein such as, for instance, the fiber 100. For example, the memory 806 can store information related to various fiber optic sensing schemes, equations or algorithms to measure strain in the fiber 100 as a function of time delay, reference wavelengths to measure strain in the fiber 100 as a function of wavelength shift of light that passes through the fiber 100, the type and locations of the fiber optic sensors 609a, 609b, 609c, 609d on the fiber 100 as measured from one end of the fiber 100, and/or other information to facilitate sensing an external magnetic field adjacent to the fiber 100. In another example, the memory 806 can also store strain data indicative of various strains experienced by the fiber 100 over a period of time as a result of the magnetostrictive element 103 being exposed to an external magnetic field.

The memory 806 can store other executable-code components for execution by the processor 803. For example, an operating system can be stored in the memory 806 for execution by the processor 803. Where any component discussed herein is implemented in the form of software, any one of a number of programming languages can be employed such as, for example, C, C++, C #, Objective C, JAVA®, JAVASCRIPT®, Perl, PHP, VISUAL BASIC®, PYTHON®, RUBY, FLASH®, or other programming languages.

As discussed above, the memory 806 can store software for execution by the processor 803. In this respect, the terms "executable" or "for execution" refer to software forms that can ultimately be run or executed by the processor 803, whether in source, object, machine, or other form. Examples of executable programs include, for instance, a compiled program that can be translated into a machine code format and loaded into a random access portion of the memory 806 and executed by the processor 803, source code that can be expressed in an object code format and loaded into a random access portion of the memory 806 and executed by the processor 803, source code that can be interpreted by another executable program to generate instructions in a random access portion of the memory 806 and executed by the processor 803, or other executable programs or code.

The local interface 809 can be embodied as a data bus with an accompanying address/control bus or other addressing, control, and/or command lines. In part, the local interface 809 can be embodied as, for instance, an on-board diagnostics (OBD) bus, a controller area network (CAN) bus, a local interconnect network (LIN) bus, a media oriented systems transport (MOST) bus, ethernet, or another network interface.

The data store 812 can include data for the computing device 800 such as, for instance, one or more unique identifiers for the computing device 800, digital certificates, encryption keys, session keys and session parameters for communications, and other data for reference and processing. The data store 812 can also store computer-readable instructions for execution by the computing device 800 via the processor 803, including instructions for the interrogator control module 815, the magnetic sensing module 818, and the communications stack 821.

In some cases, the data store 812 can also store information to facilitate the sensing of an external magnetic field adjacent to an optical fiber described herein such as, for instance, the fiber 100. For example, the data store 812 can store information related to various fiber optic sensing schemes, equations or algorithms to measure strain in the fiber 100 as a function of time delay, reference wavelengths to measure strain in the fiber 100 as a function of wavelength shift of light that passes through the fiber 100, the type and locations of the fiber optic sensors 609a, 609b, 609c, 609d on the fiber 100 as measured from one end of the fiber 100, and/or other information to facilitate sensing an external magnetic field adjacent to the fiber 100. In one example, the data store 812 can also store strain data indicative of various strains experienced by the fiber 100 over a period of time as a result of the magnetostrictive element 103 being exposed to an external magnetic field.

The interrogator control module 815 can be embodied or implemented as one or more software applications or services executing on the computing device 800. The interrogator control module 815 can be executed by the processor 803 to control the optical interrogator 606. For instance, with reference to FIG. 6, the interrogator control module 815 can cause the optical interrogator 606 to transmit light into the fiber 100 such that the light travels along the optical core 106 and passes one or more of the fiber optic sensors 609a, 609b, 609c, 609d when such sensor(s) are inscribed on the optical core 106. The interrogator control module 815 can also cause the optical interrogator 606 to detect the above-described reflections of the light that are reflected by one or more sections of the optical core 106 and/or one or more of the fiber optic sensors 609a, 609b, 609c, 609d in response to the magnetostrictive strain induced in the magnetostrictive element 103 and the optical core 106 when the fiber 100 is exposed to a magnetic field.

The magnetic sensing module 818 can be embodied or implemented as one or more software applications or services executing on the computing device 800. The magnetic sensing module 818 can be executed by the processor 803 to detect, locate, and monitor a magnetic field adjacent to the fiber 100. For instance, with reference to FIG. 6, the magnetic sensing module 818 can be configured to detect, locate, and monitor an external magnetic field adjacent to the fiber 100 by measuring the magnetostrictive strain induced in and transferred through the fiber 100. The magnetic sensing module 818 can measure and monitor such strain using the above-described light reflections detected by the optical interrogator 606. By measuring and monitoring the changes in such strain over a period of time, the magnetic sensing module 818 can confirm the presence of an external magnetic field adjacent to the fiber 100. Additionally, the magnetic sensing module 818 can also determine the intensity and/or the location or approximate location of the magnetic field by identifying which section of the optical core 106 and/or which of the fiber optic sensors 609a, 609b, 609c, 609d reflected the light reflections.

In one example, the magnetic sensing module 818 can be configured to measure the strain as a function of time delay associated with the light that passes through the optical core 106. For instance, the magnetic sensing module 818 can measure the strain as a function of a time difference between when the light is transmitted into the optical core 106 and when the light reflections are detected. In another example, the magnetic sensing module 818 can be configured to measure the strain as a function of wavelength shift of the light that passes through the optical core 106. For instance, the magnetic sensing module 818 can measure the strain as a function of a wavelength difference between the wavelength of the transmitted light and the wavelength of the light reflections. In some cases, the magnetic sensing module 818 can be configured to measure the strain based on a light scattering technique such as, for instance, Rayleigh scattering, Brillouin scattering, Raman scattering, another light scattering technique, or a combination thereof. In some cases, the magnetic sensing module 818 can be configured to measure the strain using at least one of a Mach Zehnder interferometer, a Michelson interferometer, a Fabry-Perot interferometer, a single-point sensor, a quasi-distributed (multiplexed) sensor, or a distributed sensor.

The communications stack 821 can include software and hardware layers to implement data communications such as, for instance, Bluetooth®, Bluetooth® Low Energy (BLE), WiFi®, cellular data communications interfaces, or a combination thereof. Thus, the communications stack 821 can be relied upon by the computing device 800 to establish cellular, Bluetooth®, WiFi®, and other communications channels with one or more networks and one or more devices or systems external to the computing device 800.

The communications stack 821 can include the software and hardware to implement Bluetooth®, BLE, and related networking interfaces, which provide for a variety of different network configurations and flexible networking protocols for short-range, low-power wireless communications. The communications stack 821 can also include the software and hardware to implement WiFi® communication, and cellular communication, which also offers a variety of different network configurations and flexible networking protocols for mid-range, long-range, wireless, and cellular communications. The communications stack 821 can also incorporate the software and hardware to implement other communications interfaces, such as X10®, ZigBee®, Z-Wave®, and others. The communications stack 821 can be configured to communicate various data to and from a device or system that is external to the computing device 800. For instance, the communications stack 821 can be configured to communicate strain data indicative of various strains experienced by the fiber 100 over a period of time as a result of the magnetostrictive element 103 being exposed to an external magnetic field.

Referring now to FIG. 8, an executable program can be stored in any portion or component of the memory 806 including, for example, a random access memory (RAM), read-only memory (ROM), magnetic or other hard disk drive, solid-state, semiconductor, universal serial bus (USB) flash drive, memory card, optical disc (e.g., compact disc (CD) or digital versatile disc (DVD)), floppy disk, magnetic tape, or other types of memory devices.

In various embodiments, the memory 806 can include both volatile and nonvolatile memory and data storage components. Volatile components are those that do not retain data values upon loss of power. Nonvolatile components are those that retain data upon a loss of power. Thus, the memory 806 can include, for example, a RAM, ROM, magnetic or other hard disk drive, solid-state, semiconductor, or similar drive, USB flash drive, memory card accessed via a memory card reader, floppy disk accessed via an associated floppy disk drive, optical disc accessed via an optical disc drive, magnetic tape accessed via an appropriate tape drive, and/or other memory component, or any combination thereof. In addition, the RAM can include, for example, a static random-access memory (SRAM), dynamic random-access memory (DRAM), or magnetic random-access memory (MRAM), and/or other similar memory device. The ROM can include, for example, a programmable read-only memory (PROM), erasable programmable read-only memory (EPROM), electrically erasable programmable read-only memory (EEPROM), or other similar memory device.

As discussed above, the interrogator control module 815, the magnetic sensing module 818, and the communications stack 821 can each be embodied, at least in part, by software or executable-code components for execution by general purpose hardware. Alternatively, the same can be embodied in dedicated hardware or a combination of software, general, specific, and/or dedicated purpose hardware. If embodied in such hardware, each can be implemented as a circuit or state machine, for example, that employs any one of or a combination of a number of technologies. These technologies can include, but are not limited to, discrete logic circuits having logic gates for implementing various logic functions upon an application of one or more data signals, application specific integrated circuits (ASICs) having appropriate logic gates, field-programmable gate arrays (FPGAs), or other components.

Also, any logic or application described herein, including the interrogator control module 815, the magnetic sensing module 818, and the communications stack 821 can be embodied, at least in part, by software or executable-code components, can be embodied or stored in any tangible or non-transitory computer-readable medium or device for execution by an instruction execution system such as a general-purpose processor. In this sense, the logic can be embodied as, for example, software or executable-code components that can be fetched from the computer-readable medium and executed by the instruction execution system. Thus, the instruction execution system can be directed by execution of the instructions to perform certain processes such as, for instance, the optical fiber preform and fabrication process described above with reference to the preform 500 illustrated in FIG. 5. In the context of the present disclosure, a non-transitory computer-readable medium can be any tangible medium that can contain, store, or maintain any logic, application, software, or executable-code component described herein for use by or in connection with an instruction execution system.

The computer-readable medium can include any physical media such as, for example, magnetic, optical, or semiconductor media. More specific examples of suitable computer-readable media include, but are not limited to, magnetic tapes, magnetic floppy diskettes, magnetic hard drives, memory cards, solid-state drives, USB flash drives, or optical discs. Also, the computer-readable medium can include a RAM including, for example, an SRAM, DRAM, or MRAM. In addition, the computer-readable medium can include a ROM, a PROM, an EPROM, an EEPROM, or other similar memory device.

Disjunctive language, such as the phrase "at least one of X, Y, or Z," unless specifically stated otherwise, is to be understood with the context as used in general to present that an item, term, or the like, can be either X, Y, or Z, or any combination thereof (e.g., X, Y, and/or Z). Thus, such disjunctive language is not generally intended to, and should not, imply that certain embodiments require at least one of X, at least one of Y, or at least one of Z to be each present.

As referenced herein, the term "user" refers to at least one of a human, an end-user, a consumer, a computing device and/or program (e.g., a processor, computing hardware and/or software, an application), an agent, a machine learning (ML) and/or artificial intelligence (AI) model, and/or another type of user that can implement and/or facilitate implementation of one or more embodiments of the present disclosure as described herein, illustrated in the accompanying drawings, and/or included in the appended claims. As referred to herein, the terms "includes" and "including" are intended to be inclusive in a manner similar to the term "comprising." As referenced herein, the terms "or" and "and/or" are generally intended to be inclusive, that is (i.e.), "A or B" or "A and/or B" are each intended to mean "A or B or both." As referred to herein, the terms "first," "second," "third," and so on, can be used interchangeably to distinguish one component or entity from another and are not intended to signify location, functionality, or importance of the individual components or entities. As referenced herein, the terms "couple," "couples," "coupled," and/or "coupling" refer to chemical coupling (e.g., chemical bonding), communicative coupling, electrical and/or electromagnetic coupling (e.g., capacitive coupling, inductive coupling, direct and/or connected coupling), mechanical coupling, operative coupling, optical coupling, and/or physical coupling.

It should be emphasized that the above-described embodiments of the present disclosure are merely possible examples of implementations set forth for a clear understanding of the principles of the disclosure. Many variations and modifications can be made to the above-described embodiment(s) without departing substantially from the spirit and principles of the disclosure. All such modifications and variations are intended to be included herein within the scope of this disclosure and protected by the following claims.

The invention claimed is:

1. An optical fiber, comprising:
a cladding that extends from a first end to a second end of the optical fiber;
an optical core within the cladding, the optical core extending along the optical fiber between the first end and the second end;

a magnetostrictive element within the cladding, the magnetostrictive element extending along the optical fiber between the first end and the second end; and one or more fiber optic sensors inscribed on the optical core, each of the one or more fiber optic sensors being operable to reflect light reflections in response to strain induced in the optical core by the magnetostrictive element when the optical fiber is exposed to a magnetic field.

2. The optical fiber of claim 1, wherein the cladding comprises fused silica.

3. The optical fiber of claim 1, wherein the optical core comprises germanium doped fused silica.

4. The optical fiber of claim 1, wherein the magnetostrictive element comprises nickel.

5. The optical fiber of claim 1, wherein the magnetostrictive element comprises Metglas® or Terfenol-D™.

6. The optical fiber of claim 1, wherein the magnetostrictive element comprises cobalt, an iron-cobalt (FeCo) alloy, a nickel-iron (NiFe) alloy, or an iron-gallium alloy (galfenol).

7. The optical fiber of claim 1, further comprising one or more additional magnetostrictive elements extending along the optical fiber between the first end and the second end.

8. The optical fiber of claim 7, wherein the magnetostrictive element and the one or more additional magnetostrictive elements are internally distributed around the optical core, the magnetostrictive element and the one or more additional magnetostrictive elements being spaced equidistantly from the optical core.

9. The optical fiber of claim 8, wherein the magnetostrictive element and the one or more additional magnetostrictive elements are concentrically distributed around the optical core.

10. The optical fiber of claim 7, wherein the magnetostrictive element and the one or more additional magnetostrictive elements comprise different types of magnetostrictive material.

11. The optical fiber of claim 1, wherein the optical fiber comprises a single mode optical fiber or a multimode optical fiber.

12. The optical fiber of claim 1, further comprising at least one of a plurality of fiber Bragg gratings (FBGs) or a plurality of long-period gratings (LPGs) inscribed on the optical core.

13. The optical fiber of claim 7, wherein each of the one or more additional magnetostrictive elements is positioned parallel to the optical core.

14. The optical fiber of claim 7, wherein the one or more additional magnetostrictive elements are spaced equidistantly from one another and from the optical core.

15. The optical fiber of claim 7, wherein one or more first additional magnetostrictive elements and one or more second additional magnetostrictive elements of the one or more additional magnetostrictive elements are spaced at different distances from the optical core.

16. The optical fiber of claim 1, wherein the strain is measurable as a function of time delay or wavelength shift of light that passes through the optical fiber.

17. The optical fiber of claim 16, wherein the strain is measurable based on Rayleigh scattering, Brillouin scattering, or Raman scattering.

18. An optical fiber, comprising:

an optical core that extends from a first end to a second end of the optical fiber;

a magnetostrictive element that extends along the optical fiber; and one or more fiber optic sensors inscribed on the optical core, each of the one or more fiber optic sensors being operable to reflect light reflections in response to strain induced in the optical fiber by the magnetostrictive element when the optical fiber is exposed to a magnetic field.

19. The optical fiber of claim 18, further comprising one or more additional magnetostrictive elements that extend along the optical fiber.

20. The optical fiber of claim 19, wherein the magnetostrictive element and the one or more additional magnetostrictive elements are internally distributed around the optical core and spaced equidistantly from the optical core.

* * * * *